(12) United States Patent
Huang et al.

(10) Patent No.: US 12,394,659 B2
(45) Date of Patent: Aug. 19, 2025

(54) SUSCEPTORS WITH FILM DEPOSITION CONTROL FEATURES

(71) Applicant: ASM IP Holding B.V., Almere (NL)

(72) Inventors: Shujin Huang, Tempe, AZ (US); Junwei Su, Tempe, AZ (US); Xing Lin, Chandler, AZ (US); Alexandros Demos, Scottsdale, AZ (US); Rutvij Naik, Tempe, AZ (US); Wentao Wang, Chandler, AZ (US); Matthew Goodman, Chandler, AZ (US); Robin Scott, Phoenix, AZ (US); Amir Kajbafvala, Chandler, AZ (US); Robinson James, Phoenix, AZ (US); Youness Alvandi-Tabrizi, Tempe, AZ (US); Caleb Miskin, Mesa, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/730,967

(22) Filed: Apr. 27, 2022

(65) Prior Publication Data
US 2022/0352006 A1   Nov. 3, 2022

Related U.S. Application Data

(60) Provisional application No. 63/182,601, filed on Apr. 30, 2021.

(51) Int. Cl.
*H01L 21/687* (2006.01)
*C23C 16/458* (2006.01)
*C23C 16/52* (2006.01)

(52) U.S. Cl.
CPC .... *H01L 21/68785* (2013.01); *C23C 16/4581* (2013.01); *C23C 16/4585* (2013.01);
(Continued)

(58) Field of Classification Search
CPC ......... H01L 21/68785; H01L 21/68735; H01L 21/68757; C23C 16/4581; C23C 16/4585;
(Continued)

(56) References Cited

U.S. PATENT DOCUMENTS

| 5,556,476 A | 9/1996 | Lei et al. |
| 5,960,555 A * | 10/1999 | Deaton ............. C23C 16/45521 34/58 |

(Continued)

FOREIGN PATENT DOCUMENTS

| CN | 106715753 A | 5/2017 |
| JP | 6459801 B2 | 1/2019 |

OTHER PUBLICATIONS

EPO; Partial Search Report dated Feb. 22, 2023 in Application No. 22171025.4.

*Primary Examiner* — Charlee J. C. Bennett
(74) *Attorney, Agent, or Firm* — Banner & Witcoff, Ltd.

(57) ABSTRACT

A susceptor has a circular pocket portion, an annular ledge portion, and an annular rim ledge portion. The circular pocket portion is arranged along a rotation axis and has a perforated surface. The annular ledge portion extends circumferentially about pocket portion and has ledge surface that slopes axially upward from the perforated surface. The rim portion extends circumferentially about the ledge portion and is connected to the pocket portion by the ledge portion of the susceptor. The susceptor has one or more of a tuned pocket, a contact break, a precursor vent, and a purge channel located radially outward of the perforated surface to control deposition of a film onto a substrate supported by the susceptor. Semiconductor processing systems, film deposition methods, and methods of making susceptors are also described.

23 Claims, 22 Drawing Sheets

(52) U.S. Cl.
CPC .......... *C23C 16/4586* (2013.01); *C23C 16/52* (2013.01); *H01L 21/68735* (2013.01); *H01L 21/68757* (2013.01)

(58) Field of Classification Search
CPC ................ C23C 16/4586; C23C 16/52; H01J 2237/332–3348
USPC ................... 118/715–733; 156/345.1–345.55
See application file for complete search history.

(56) References Cited

U.S. PATENT DOCUMENTS

| | | | |
|---|---|---|---|
| 6,040,011 A | 3/2000 | Yudovsky et al. | |
| 6,444,027 B1 | 9/2002 | Yang et al. | |
| 6,521,503 B2 | 2/2003 | Jacobson | |
| 6,554,905 B1 | 4/2003 | Goodwin | |
| 6,634,882 B2 | 10/2003 | Goodman | |
| 6,709,267 B1 | 3/2004 | Hawkins | |
| 6,729,875 B2 | 5/2004 | Goodman | |
| 6,776,849 B2 | 8/2004 | Aggarwal | |
| 6,840,767 B2 | 1/2005 | Goodman | |
| 6,861,321 B2 | 3/2005 | Keeton | |
| 7,033,445 B2 | 4/2006 | Keeton | |
| 7,070,660 B2 | 7/2006 | Keeton | |
| 7,231,141 B2 | 6/2007 | Jacobson | |
| 7,449,071 B2 | 11/2008 | Aggarwal | |
| D600,223 S | 9/2009 | Aggarwal | |
| 7,601,224 B2 | 10/2009 | Foree | |
| 7,648,579 B2 | 1/2010 | Goodman | |
| 8,088,225 B2 | 1/2012 | Goodman | |
| 8,394,229 B2 | 3/2013 | Aggarwal | |
| 8,801,857 B2 | 8/2014 | Aggarwal | |
| D743,357 S | 11/2015 | Vyne | |
| 10,732,046 B2 | 8/2020 | Leow | |
| D914,620 S | 3/2021 | Rokkam | |
| 11,018,047 B2 | 5/2021 | Rokkam | |
| D920,936 S | 6/2021 | Rokkam | |
| D947,913 S | 4/2022 | Patil | |
| 2008/0314319 A1* | 12/2008 | Hamano | C30B 25/12 118/500 |
| 2013/0109192 A1* | 5/2013 | Hawkins | C23C 16/45521 438/758 |
| 2014/0338596 A1 | 11/2014 | Aggarwal | |
| 2015/0275395 A1* | 10/2015 | Kang | C23C 16/4585 118/728 |
| 2016/0133504 A1 | 5/2016 | Chu et al. | |
| 2020/0211850 A1* | 7/2020 | Donofrio | H01L 21/02002 |
| 2021/0111059 A1 | 4/2021 | Ulavi et al. | |
| 2021/0125853 A1* | 4/2021 | Rathi | H01L 21/67115 |
| 2021/0225688 A1* | 7/2021 | Goodman | H01L 21/0262 |
| 2023/0128390 A1* | 4/2023 | Huang | C23C 16/45591 414/217 |

* cited by examiner

SUSCEPTORS WITH FILM DEPOSITION CONTROL FEATURES

CROSS-REFERENCE TO RELATED APPLICATIONS

This application is a Non-provisional of, and claims priority to and the benefit of, U.S. Provisional Patent Application No. 63/182,601, filed Apr. 30, 2021 and entitled "SUSCEPTORS WITH FILM DEPOSITION CONTROL FEATURES," which is hereby incorporated by reference herein.

FIELD OF INVENTION

The present disclosure generally relates to depositing films onto substrates using semiconductor processing systems. More specifically, the present disclosure relates controlling characteristics of films deposited onto substrates using semiconductor processing systems.

BACKGROUND OF THE DISCLOSURE

Films are commonly deposited onto substrates to fabricate semiconductor devices, such as using epitaxial techniques in chemical vapor deposition process tools. Such films are generally deposited by supporting the substrate within the process tool, typically on a substrate support structure. The process tool maintains the substrate and the substrate support structure within an environment suitable for depositing the film from a precursor gas flowed through the process tool and across the substrate. As the precursor gas flows across the substrate a film progressively develops on the substrate, flow of the precursor gas ceasing once the film is sufficiently developed and the substrate thereafter removed from the process tool.

In some process tools, the film deposited onto the substrate may thicken or thin at the edge of the substrate relative to the interior portion of the substrate surface. Bridging may also develop between the substrate and the substrate support structure, for example between the lower surface of the substrate and the substrate support structure and/or between the edge of the substrate and the substrate support structure. While generally acceptable for their intended purpose, thickening and/or thinning of the film at the edge of substrate may alter the electrical properties of the film in relation to the film at interior regions of the substrate, potentially making the semiconductor devices located proximate to the edge less reliable than other semiconductor devices located at interior regions of the substrate. And bridging, once formed, may mechanically fix the substrate to the substrate support structure, potentially leading to substrate damage upon removal of the substrate from the substrate support structure and/or during subsequent processing of the substrate. The risk of substrate damage can be relatively high in deposition techniques employed to deposit relatively thick films, such as in semiconductor devices employed in power electronics.

Various countermeasures exist to control thickening and/or thinning of films at the edge of the substrate and bridging between the substrate and the substrate support structure. For example, edge thickness may be controlled by rotating the substrate during the development of the film on the substrate surface. Bridging may be controlled using multi-pass deposition techniques, where the film is deposited using two or more deposition events. In such techniques the substrate is generally removed from the substrate support structure between the deposition events to fracture bridging that may have developed between the substrate and the substrate support structure, the substrate thereafter returned to the substrate support structure for the subsequent deposition event. This allow any bridging that may have formed between the susceptor and the substrate to fractured while relatively thin, limiting risk of substrate damage by limiting the force applied to the substrate to fracture the bridging. In some deposition operations, the reduced risk of substrate damage is sufficient to offset the throughput reduction associated with the unload event.

Such systems and methods have generally been considered suitable for their intended purpose. However, there remains a need in the art for improved susceptors, semiconductor processing systems, and film deposition methods. The present disclosure provides a solution to one or more of these needs.

SUMMARY OF THE DISCLOSURE

A susceptor is provided. The susceptor has a circular pocket portion arranged along a rotation axis with a perforated surface; an annular ledge portion extending circumferentially about pocket portion and having a ledge surface, the ledge surface sloping upward along the rotation axis from the perforated surface; and an annular rim portion extending circumferentially about the ledge portion, connected to the pocket portion by the ledge portion of the susceptor and having a rim surface axially offset from the ledge surface of the susceptor. The rim portion and the ledge surface of the susceptor define therebetween a tuned pocket to tune an edge thickness profile of a film deposited onto a substrate supported on the ledge surface of the susceptor.

In certain examples, the tuned pocket may define a flattening pocket depth selected to flatten film thickness radially inward of the periphery of the substrate relative to the radially inner region of the substrate.

In certain examples, the flattening pocket depth may be greater than a roll-up pocket depth. The flattening pocket depth may be less than a roll-down pocket depth.

In certain examples, a substrate may be supported by on the ledge surface of the ledge portion of the susceptor. The flattening pocket depth may be selected such that a topside of the substrate is arranged axially between the rim surface of the rim portion of susceptor and the perforated surface of the pocket portion of the susceptor.

In certain example, the tuned pocket may define a roll-up pocket depth configured to increase film thickness deposited onto the substrate radially inward of the periphery of the substrate relative to the radially inner region of the substrate.

In certain examples, the roll-up pocket depth may be less than a flattening pocket depth. The roll-up pocket depth may be less than a roll-down flattening pocket depth.

In certain examples, a substrate may be supported by the ledge surface of the susceptor. The roll-up pocket depth may be selected such that a topside of the substrate is substantially coplanar with the rim surface of the rim portion of the susceptor along the rotation axis.

In certain examples, the tuned pocket may define a roll-down pocket depth configured to decrease film thickness deposited onto the substrate radially inward of the periphery of the substrate relative to the radially inner region of the substrate.

In certain examples, the roll-down pocket depth may be greater than a roll-up pocket depth. The roll-down pocket depth may be greater than a flattening pocket depth.

In certain examples, a substrate may be supported by on the ledge surface of the ledge portion of the susceptor. The roll-down pocket depth may be selected such that a topside of the substrate is arranged axially between the rim surface of the rim portion of susceptor and the perforated surface of the pocket portion of the susceptor.

In certain examples, the susceptor may be formed from graphite. The graphite may be encapsulated with a silicon carbide coating.

In certain examples, the susceptor may have (a) a contact break located on the ledge surface of the susceptor to limit contact between the substrate and the ledge surface of the susceptor, (b) a purge channel array located on the ledge surface of the susceptor to flow a purge gas between the periphery of the substrate and the ledge surface of the susceptor, or (c) a precursor vent array located radially outward of the perforated surface to vent precursor from within a gap defined between the substrate and the rim portion of the susceptor.

A semiconductor processing system is provided. The semiconductor processing system includes a reactor having a hollow interior; a divider seated within the interior of the reactor with a divider aperture, the divider dividing the interior of the reactor into an upper chamber and a lower chamber; and a susceptor as described above. The susceptor is arranged within the interior of the reactor and supported for rotation about the rotation axis, the rotation axis extending through the divider aperture; a purge source is connected to the reactor and configured to flow a purge gas through the lower chamber of the reactor; and a precursor source is connected to the reactor and configured to flow a precursor through the upper chamber of the reactor.

A film deposition method is provided. The method includes, at a susceptor as described above, supporting a substrate on the ledge surface of the susceptor, the substrate having a topside and an underside axially separated from one another by a periphery of the substrate; flowing a purge gas through the perforated surface and into a purged volume defined between the underside of the substrate and the perforated surface of the susceptor; and flowing a precursor across the topside of the substrate. A film is deposited onto the topside of the substrate using the precursor and edge thickness of the film is tuned using the tuned pocket defined by the susceptor.

In certain examples, the tuned pocket may be a flattening pocket depth and the method may further include homogenizing precursor concentration within the gap relative to precursor at a radially inner region of the substrate.

In certain examples, the tuned pocket may be a roll-up pocket depth and the method may further include increasing precursor concentration within the gap relative to precursor at a radially inner region of the substrate.

In certain examples, the tuned pocket may be a roll-down pocket depth and the method may include decreasing precursor concentration within the gap relative to precursor at a radially inner region of the substrate.

In certain examples, the method may include limiting contact between the substrate and the ledge surface of the susceptor with a contact break located on the ledge surface of the susceptor.

In certain examples, the method may include flowing a purge gas between the periphery of the substrate and the ledge surface of the susceptor with a purge channel array located on the ledge surface of the susceptor.

In certain examples, the method may include venting precursor from a gap defined between a periphery of the substrate and the rim portion of the susceptor using a precursor vent array located radially outward of the perforated surface of the susceptor.

A susceptor is provided. The susceptor has a circular pocket portion arranged along a rotation axis and having a perforated surface; an annular ledge portion extending circumferentially about pocket portion and having a ledge surface, the ledge surface sloping upward along the rotation axis from the perforated surface; and an annular rim portion extending circumferentially about the ledge portion, connected to the pocket portion by the ledge portion of the susceptor and having a rim surface axially offset from the ledge surface of the susceptor. The ledge surface has a contact break extending radially between the perforated surface and rim surface to discontinuously support a substrate on the ledge surface of the susceptor.

In certain examples, the contact break may extend continuously about the pocket portion of the susceptor.

In certain examples, the contact break may extend radially outward from the perforated surface of the susceptor.

In certain examples, the contact break may extend radially inward from a radially-inner periphery of the susceptor.

In certain examples, the contact break may include an unpolished region of the ledge surface of the susceptor.

In certain examples, the contact break may include a partially polished region of the ledge surface of the susceptor.

In certain examples, the contact break may fluidly couple the perforated surface of the susceptor with the rim surface of the susceptor.

In certain examples, the contact break may include a roughened region of the ledge surface of the susceptor.

In certain examples, the contact break may include (a) an unpolished region, (b) a partially polished region, or (c) a roughened region located on the ledge surface of the susceptor, the region having a roughness between about 0.2 microns and about 5.0 microns.

In certain examples, the contact break may include a purge slot defined within the ledge surface of the susceptor.

In certain examples, the contact break may include a grid structure with two or more teeth distributed radially along the ledge surface and circumferentially about the pocket portion of the susceptor.

In certain examples, the contact break may include (a) an unpolished region, (b) a partially polished region, (c) a roughened region comprises, (d) a purge channel, or (e) a grid structure located on the ledge surface of the susceptor. A substrate with a periphery may overlie the contact break and be discontinuously supported by the susceptor by the contact break.

In certain examples, the susceptor may be formed from graphite. The susceptor may have a coating. The coating may encapsulate the susceptor. The coating may be a silicon carbide coating.

In certain examples, the susceptor may have at least one of (a) a tuned pocket defined between the rim surface of the susceptor and a support circumference extending along the ledge surface and about the perforated surface of the susceptor; (b) a purge channel array located on the ledge surface of the susceptor to flow a purge gas between the periphery of the substrate and the ledge surface of the susceptor; and (c) a precursor vent array located radially outward of the perforated surface to vent precursor from within a gap defined between the substrate and the rim portion of the susceptor.

A semiconductor processing system is provided. The semiconductor processing system includes a reactor with a hollow interior; a divider seated within the interior of the reactor with a divider aperture, the divider dividing the interior of the reactor into an upper chamber and a lower chamber; and a susceptor as described above. The susceptor is arranged within the interior of the reactor and is supported for rotation about the rotation axis and the rotation axis extends through the divider aperture. A purge source is connected to the reactor and is configured to flow a purge gas through the lower chamber of the reactor, a precursor source is connected to the reactor and is configured to flow a precursor through the upper chamber of the reactor, and the contact break fluidly couples the purge source with the upper chamber of the reactor through lower chamber of the reactor and the perforated surface of the susceptor.

A film deposition method is provided. The method includes, at a susceptor as described above; discontinuously supporting a substrate on the ledge surface of the susceptor, the substrate having a topside and an underside axially separated from one another by a periphery of the substrate; flowing a purge gas through the perforated surface and into a purged volume defined between the underside of the substrate and the perforated surface of the susceptor; and flowing a precursor across the topside of the substrate. A film is deposited onto the topside of the substrate using the precursor and the purge gas flowed between the periphery of the substrate and the ledge surface of the susceptor through the contact break located on the ledge surface of the susceptor.

A method of making a susceptor is provided. The method includes defining a susceptor having a circular pocket portion arranged along a rotation axis and having a perforated surface; an annular ledge portion extending circumferentially about pocket portion and having a ledge surface, the ledge surface sloping upward along the rotation axis from the perforated surface; and an annular rim portion extending circumferentially about the ledge portion, connected to the pocket portion by the ledge portion of the susceptor, and having a rim surface axially offset from the ledge surface of the susceptor. A region of the ledge surface is roughened by cyclically etching and depositing a film onto the ledge surface of the susceptor without a substrate supported by the susceptor.

In certain examples, the method may include cyclically etching and depositing a film onto the ledge surface of the susceptor comprises cyclically (a) etching the ledge surface with a mixture of hydrochloric acid (HCl) and hydrogen ($H_2$) gas, and (b) depositing a silicon layer onto the ledge surface.

In certain examples, cyclically etching and depositing the film onto the ledge surface of the susceptor may include, in the aggregate, (a) etching the ledge surface for more than 1000 minutes, and (b) depositing more than 4000 microns of film onto the ledge surface.

In certain examples, the method may further include depositing a silicon-containing precoat onto the ledge surface having a thickness of between about 1 micron and about 3 microns.

A susceptor is provided. The susceptor has a circular pocket portion arranged along a rotation axis and having a perforated surface; an annular ledge portion extending circumferentially about pocket portion and having a ledge surface, the ledge surface sloping axially upward from the perforated surface; and an annular rim portion extending circumferentially about the ledge portion and connected to the pocket portion by the ledge portion of the susceptor. A precursor vent with a precursor vent inlet extends through the susceptor, the precursor vent inlet located radially outward of the perforated surface to vent precursor from a gap defined between a periphery of a substrate supported on the ledge surface of the susceptor and the rim portion of the susceptor.

In certain examples, the precursor vent may be a first precursor vent, the precursor vent inlet may be a first precursor vent inlet, and the susceptor may have one or more second precursor vent with a second precursor vent inlet. The second precursor vent inlet may be located radially outward of the perforated surface and circumferentially offset from the first precursor vent inlet about the pocket portion of the susceptor.

In certain examples, the precursor vent may extend outward from the precursor vent inlet to a precursor vent outlet, the precursor vent outlet fluidly may be coupled to the precursor vent inlet by the precursor vent, and the precursor vent outlet may be located on a radially-outer periphery of the susceptor.

In certain examples, the precursor vent outlet may be located axially on a side of the ledge surface opposite the perforated surface of the susceptor.

In certain examples, the precursor vent outlet may be located axially between the ledge surface and the perforated surface of the susceptor.

In certain examples, the precursor vent may extend axially from the precursor vent inlet and toward a lower surface of the susceptor.

In certain examples, the precursor vent may have precursor vent outlet. The precursor vent may be fluidly coupled to the precursor vent inlet by the precursor vent and the precursor vent outlet may be located on the lower surface of the susceptor.

In certain examples, the precursor vent inlet may be located on a radially-inner circumference of the susceptor.

In certain examples, the precursor vent may have a precursor vent outlet. The precursor vent may be fluidly coupled to the precursor vent inlet by the precursor vent and the precursor vent outlet may be located on a radially-outer periphery of the susceptor.

In certain examples, the precursor vent inlet may be located on the ledge surface of the susceptor.

In certain examples, the susceptor may have a purge channel extending therethrough with a purge channel outlet. The purge channel outlet may be located radially between the perforated surface of the susceptor and the precursor vent inlet.

In certain examples, a substrate with a periphery may be supported on the ledge surface of the susceptor. The substrate may axially overlay the purge channel outlet and the periphery of the substrate may radially separate the purge channel outlet from the precursor vent inlet.

In certain examples, the ledge surface may have a contact break radially between the precursor vent inlet and the purge channel outlet. The ledge surface may be configured such that the periphery of the substrate radially separates the purge gas outlet from the precursor vent inlet.

In certain examples, the ledge surface may have a contact break located radially between the precursor vent inlet and the perforated surface of the substrate.

In certain examples, the contact break may include a grid structure defined by the ledge surface of the susceptor.

In certain examples, the contact break may include an unpolished region on the ledge surface of the susceptor. The unpolished region may have a roughness that is between about 0.2 microns and about 5 microns.

In certain examples, the contact break may include a partially polished region on the ledge surface of the susceptor. The partially polished region may have a roughness that is between about 0.2 microns and about 5 microns.

In certain examples, the contact break may include a roughened region on the ledge surface of the susceptor. The roughened region may have a roughness that is between about 0.2 microns and about 5 microns.

A semiconductor processing system is provided. The semiconductor processing system includes a reactor with a hollow interior; a divider seated within the interior of the reactor with a divider aperture, the divider dividing the interior of the reactor into an upper chamber and a lower chamber; and a susceptor as described above. The susceptor is arranged within the interior of the reactor and supported for rotation about the rotation axis, the rotation axis extends through the divider aperture, a purge source connected to the reactor and is configured to flow a purge gas through the lower chamber of the reactor, and a precursor source connected to the reactor and is configured to flow a precursor through the upper chamber of the reactor. The precursor vent inlet is located in the upper chamber of the reactor to vent the precursor from a gap defined between the rim portion of the susceptor and the periphery of the substrate supported on the ledge surface of the susceptor.

A film deposition method is provided. The film deposition method includes, at a susceptor as described above, supporting a substrate having a topside and an underside axially separated from one another by a periphery of the substrate supported by the susceptor, flowing a purge gas through the perforated surface and into a purged volume defined between the underside of the substrate and the perforated surface of the susceptor, and flowing a precursor across the topside of the substrate. A film is deposited onto the topside of the substrate using the precursor and precursor is vented from a gap defined between the periphery of the substrate and the rim portion of the susceptor. Optionally, purge gas is flowed from the purged volume to the precursor vent inlet along the ledge surface of the susceptor and between the periphery of the substrate and the ledge surface of the susceptor.

A susceptor is provided. The susceptor includes a circular pocket portion arranged along a rotation axis and having a perforated surface, an annular ledge portion extending circumferentially about pocket portion and having a ledge surface that slopes upward along the rotation axis from the perforated surface, and an annular rim portion extending circumferentially about the ledge portion. The rim portion is connected to the pocket portion by the ledge portion of the susceptor and has a rim surface axially offset from the ledge surface of the susceptor. The ledge portion has a purge channel extending therethrough to issue purge gas against an underside of a substrate supported on the ledge surface of the susceptor.

In certain examples, the purge channel may be one of a plurality of purge channels distributed circumferentially about the perforated surface of susceptor.

In certain examples, the purge channel may have a purge channel outlet. The purge channel may be located on the ledge surface of the susceptor.

In certain examples, the ledge surface may have a support circumference extending about the perforated surface of the susceptor. The purge channel outlet may be located radially between the perforated surface of susceptor and the support circumference.

In certain examples, a substrate with a periphery may be supported by the ledge portion of the susceptor and the purge channel outlet may be located radially between the periphery of the substrate and the perforated surface of the susceptor.

In certain examples, the purge channel may have a purge channel inlet located on the lower surface of the susceptor.

In certain examples, the purge channel may connect the purge channel inlet to a purge channel outlet located on the ledge surface of the susceptor.

In certain examples, the purge channel may extend axially between the purge channel inlet to the ledge surface of the susceptor.

In certain examples, the ledge surface may have a contact break located radially between rim portion and the perforated surface of the susceptor. The contact break may fluidly couple the purge channel with the rim portion of the susceptor.

In certain examples, the contact break may include one of (a) an unpolished region, (b) a partially polished region, and (c) a roughened region fluidly coupling the purge channel to the rim portion of the susceptor.

In certain examples, the contact break may include one of (a) a purge slot and a (b) a grid structure fluidly coupling the purge channel to the rim portion of the susceptor.

In certain examples, a substrate with a periphery may be discontinuously supported on susceptor by the contact break and the contact break may be located axially between the periphery of the substrate and the ledge portion of the susceptor.

In certain examples, the ledge portion may have a contact break located on the ledge surface of the susceptor radially between the rim portion and the perforated surface of the susceptor. The contact break may fluidly separate the purge channel from the rim portion of the susceptor.

In certain examples, the susceptor may have a precursor vent located radially outward of the perforated surface of the susceptor. The precursor vent may be fluidly coupled to the purge channel.

In certain examples, the purge channel may be located radially inward of the precursor vent.

In certain examples, the ledge surface may have a contact break arranged radially between the perforated surface and the rim portion of the susceptor. The contact break may fluidly couple the purge channel to the precursor vent.

In certain examples, a substrate with a periphery may be supported on the ledge surface of the susceptor and the periphery of the substrate may be located radially between the purge channel and the precursor vent.

A semiconductor processing system is provided. The semiconductor processing system includes a reactor having a hollow interior, a divider seated within the interior of the reactor with a divider aperture, the divider dividing the interior of the reactor into an upper chamber and a lower chamber, and a susceptor as described above. The susceptor in is arranged within the interior of the reactor and supported for rotation about the rotation axis, the rotation axis extending through the divider aperture. A purge source is connected to the reactor and is configured to flow a purge gas through the lower chamber of the reactor. A precursor source is connected to the reactor and is configured to flow a precursor through the upper chamber of the reactor. The purge channel fluidly couples the purge source to the upper chamber of the reactor through the susceptor and the lower chamber of the reactor.

A film deposition method is provided. The method includes, at a susceptor as described above, supporting a substrate on the ledge surface of the susceptor, the substrate having a topside and an underside axially separated from one another by a periphery of the substrate; flowing a purge gas through the perforated surface and into a purged volume defined between the underside of the substrate and the perforated surface of the susceptor; and flowing a precursor across the topside of the substrate. A film is deposited onto the topside of the substrate using the precursor and purge gas issued against the underside of the substrate at a location radially between the perforated surface of the susceptor and the periphery of the substrate through the purge channel.

A method of making a susceptor is provided. The method includes defining a susceptor having a circular pocket portion with a perforated surface, an annular ledge portion extending about the pocket portion and having a ledge surface sloping axially upward from the perforated surface, and an annular rim portion connected to the pocket portion by the ledge portion and having a rim surface. A tuned pocket is defined axially between the rim surface and the ledge surface of the susceptor. A precursor vent is defined within the susceptor with a precursor vent inlet located radially outward of the perforated surface of the susceptor. A contact break is defined on the ledge surface of the susceptor at a location radially between the perforated surface and the rim portion of the susceptor. A purge channel is defined within the susceptor with a purge channel inlet located on the ledge surface of the susceptor.

In certain examples, the susceptor may be formed from graphite.

In certain examples, the susceptor may include a coating. The coating may encapsulate the susceptor. The coating may be a silicon carbide coating.

In certain examples, the coating may be a first coating, and a second coating may overlay the first coating. The second coating may radially span the ledge surface of the susceptor. The second coating may extend circumferentially about ledge surface.

In certain examples, the second coating may include silicon.

In certain examples the second coating may have a thickness that is between about 1 micron and about 3 microns.

In certain examples, the method may include seasoning the ledge surface by cyclically (a) etching the ledge surface, and (b) depositing a silicon coating onto the ledge surface of the susceptor for a predetermined number of coat/etch cycles. Etching may be accomplished using hydrochloric acid (HCl) or a mixture of hydrochloric acid (HCl) and hydrogen ($H_2$) gas. Each etching cycle may be about 2 minutes in duration. Coating may be accomplished between a temperature of about 1000 degrees Celsius and about 1250 degrees Celsius. Coating may be accomplished at a temperature of about 1160 degrees Celsius. Each coating cycle may include depositing a silicon layer having a thickness of about 1 micron. The predetermined number of coat/etch cycles may be between about 400 cycle and about 600 cycles. The predetermined number of coat/etch cycles may be about 500 cycles.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

FIGS. 17A-17E are block diagrams of a method(s) for making a susceptor in accordance with the present disclosure, showing operations of the method according to an illustrative and non-limiting example of the method; and FIGS. 18A-18E are block diagrams of a method(s) of depositing a film onto a substrate in accordance with the present disclosure, showing operations of the method according to an illustrative and non-limiting example of the method.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Figure 1:
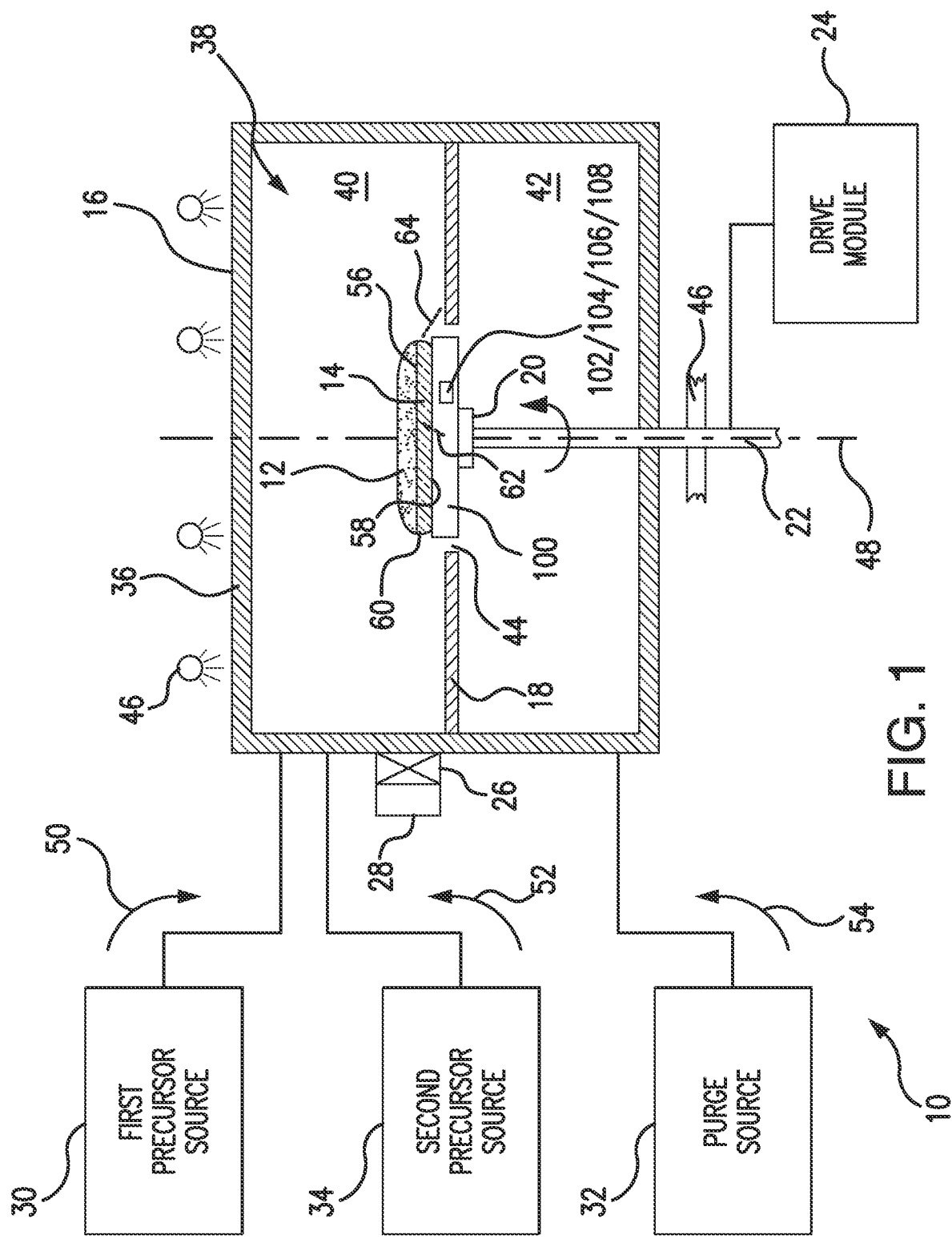
FIG. 1 is a schematic view of a semiconductor processing system constructed in accordance with the present disclosure, showing a susceptor supporting a substrate during deposition of a film onto a topside of the substrate.

Reference will now be made to the drawings wherein like reference numerals identify similar structural features or aspects of the subject disclosure. For purposes of explanation and illustration, and not limitation, a partial view of an example of a susceptor in accordance with the disclosure is shown in FIG. 1 and is designated generally by reference character 100. Other embodiments of susceptors, semiconductor processing systems, and film deposition methods in accordance with the present disclosure, or aspects thereof, are provided in FIGS. 2-18E, as will be described. The susceptors, semiconductor processing systems and film deposition methods described herein can be used to deposit films onto substrates, such as in atmospheric chemical vapor deposition (CVD) systems using epitaxial deposition techniques, during the fabrication of semiconductor devices like very large-scale integration circuits. However, the present disclosure is not limited to CVD semiconductor processing system, epitaxial deposition techniques, or to the fabrication of any particular type of semiconductor device in general.

Referring to FIG. 1, a semiconductor processing system 10 is shown. The semiconductor processing system 10 is configured for depositing a film onto a substrate, e.g., a film 12 onto a substrate 14, and in this respect includes a reactor 16, a divider 18, and a spider 20. The semiconductor processing system 10 also includes a shaft 22, a drive module 24, and a gate valve 26. The semiconductor processing system 10 further includes a substrate handler 28, a first precursor source 30, a second precursor source 34, and a purge source 32. Although a particular type of semiconductor processing system is shown and described herein for purposes of illustrating certain features of the present disclosure, e.g., a single-wafer atmospheric CVD semiconductor processing system employed to deposit thick films using epitaxial deposition techniques, it is to be understood and appreciated that other types of semiconductor processing systems such as atomic layer deposition semiconductor processing systems can also benefit from the present disclosure.

The reactor 16 has a wall 36 that bounds a hollow interior 38 of the reactor 16. The divider 18 is fixed within the interior 38 of the reactor 16, divides the interior 38 into an upper chamber 40 and a lower chamber 42, and has a divider aperture 44. The divider aperture 44 is arranged to receive therethrough the susceptor 100 and fluidly couples the lower chamber 42 of the reactor 16 with the upper chamber 40 of the reactor 16. The gate valve 26 is connected to the reactor 16 and is configured to provide access to the interior 38 of the reactor 16 from the external environment. The substrate handler 28 is located outside of the reactor 16, is connected to the gate valve 26, and is configured to place and retrieve substrates, e.g., the substrate 14, from within the interior 38 of the reactor 16. In certain examples, the reactor 16 may be formed from a transmissive material, such as quartz by way of non-limiting example. In accordance with certain examples, the substrate handler 28 may include a wafer handling module. It is also contemplated that, in certain examples, one or more lamps or lamp banks 46 may be positioned outside of the reactor 16 to communicate thermal energy into the interior 38 of the reactor 16.

The susceptor 100 is supported within the interior 38 of the reactor 16 for rotation about a rotation axis 48 and is arranged along the rotation axis 48. The rotation axis 48 in turn extends through the hollow interior 38 of the reactor 16, i.e., from the lower chamber 42, through the divider aperture 44, and into the upper chamber 40 of the reactor 16. The susceptor 100 is seated on the spider 20 and is fixed in rotation relative to the spider 20 for rotation therewith about the rotation axis 48 relative to the reactor 16. The spider 20 in turn is arranged along the rotation axis 48, is connected to the shaft 22, and is fixed in rotation relative to the shaft 22. The shaft 22 is arranged along the rotation axis 48, operatively connects the drive module 24 to the spider 20 and the susceptor 100, and is connected through the spider 20 to the susceptor 100 for rotating the susceptor 100 about the rotation axis 48.

The precursor source 30 is connected to the reactor 16 and is configured to flow a precursor 50 through the upper chamber 40 of the reactor 16. In certain examples, the precursor may include a reactive material, such as a reactive material (e.g., a reactant) suitable for an epitaxial or an atomic layer deposition operation. In accordance with certain examples, the precursor 50 may include a silicon-containing precursor, such as employed in an epitaxial film deposition operation. The silicon-containing precursor can include monosilane ($SiH_4$), dichlorosilane ($SiH_2Cl_2$), and/or trichlorosilane ($HCl_3Si$) by way of non-limiting examples.

The purge source 32 is connected to the reactor 16 and is configured to flow a purge gas 54 through the lower chamber 42 of the reactor 16. The purge gas may be selected to discourage film deposition onto surfaces contacted by the purge gas 54. In certain examples, the purge gas 54 may include hydrogen ($H_2$) gas, hydrochloric acid (HCl), or mixtures of hydrochloric acid (HCl) and hydrogen ($H_2$) gas.

In certain examples, the precursor source 30 may be one of a plurality of precursor sources. In this respect, and as shown in FIG. 1, the precursor source 30 is a first precursor source 30, and the semiconductor processing system 10 includes a second precursor source 34. The second precursor source 32 is connected to the reactor 16 and is configured to flow a second precursor 52 through the upper chamber 40 of the reactor 16. In certain examples, the second precursor 52 may be flowed sequentially with the first precursor 50 (e.g., a first precursor gas) through the upper chamber 40 of the reactor 16, such as during an epitaxial or an atomic layer deposition operation. In accordance with certain examples, the second precursor 52 (e.g., a second precursor gas) may be intermixed with the first precursor 50 for coincident flow of each through the upper chamber 40 of the reactor 16, such as during a CVD and/or an epitaxial deposition operation. It is also contemplated that the second precursor 52 may include a dopant. For example, a first precursor may include a dopant and hydrogen and a second precursor may include a silicon source as well as a dopant (or the dopant) and hydrogen. Examples of suitable dopants include band gap-engineering dopants like germanium (Ge), n-type dopants like boron (B), and p-type dopants like arsenic (As).

The substrate 14 is supported along the rotation axis 48 by the susceptor 100 and has a topside 56, an underside 58, and a periphery 60. The topside 56 and the underside 58 of the substrate 14 are axially spaced apart from one another along the rotation axis 48 and are connected to one another by the periphery 60 of the substrate 14. The periphery 60 of the substrate 14 in turn extends about the rotation axis 48 and connects the topside 56 to the underside 58 of the substrate 14. In certain examples, the substrate 14 may include a silicon wafer, e.g., a 300-millimeter wafer having a thickness that is about 750 microns, and the periphery 60 include a chamber or a bevel. In accordance with certain examples, the examples, the periphery 60 of the substrate 14 may be in intimate mechanical contact with the susceptor 100. In such examples the periphery 60 of the substrate 14 be supported directly against the surface of the susceptor 100 during deposition of the film 12 onto the topside 56 of the substrate 14, the underside 58 of the substrate 14 may be spaced apart from the susceptor 100 during deposition of the film 12 onto the topside 56 of the substrate 14, and the substrate 14 may be supported by the susceptor 100 through the periphery 60 of the substrate 14 during deposition of the film 12 onto the topside 56 of the substrate 14.

As has been stated above, film thickness may vary at the edge of the substrate in relation to interior regions of the substrate. For example, roll-up edge thickness profiles or roll-down edge thickness profiles, e.g., the roll-up edge thickness profile C (shown in FIG. 3B) or the roll-down edge thickness profile D (shown in FIG. 3C), may develop in the film 12 deposited onto the topside 56 of the substrate 14. Bridging may form between the substrate and the substrate support structure supporting the substrate, e.g., underside bridging 62 and/or edge bridging 64, during deposition of the film 12 onto the topside 56 of the substrate 14. To control either (or both) edge roll-up, edge roll-down, and/or bridging between the substrate 14 and the susceptor 100, the susceptor 100 includes a tuned pocket 102, a contact break 104, a precursor vent array 106, and/or a purge channel array 108.

Figure 2:
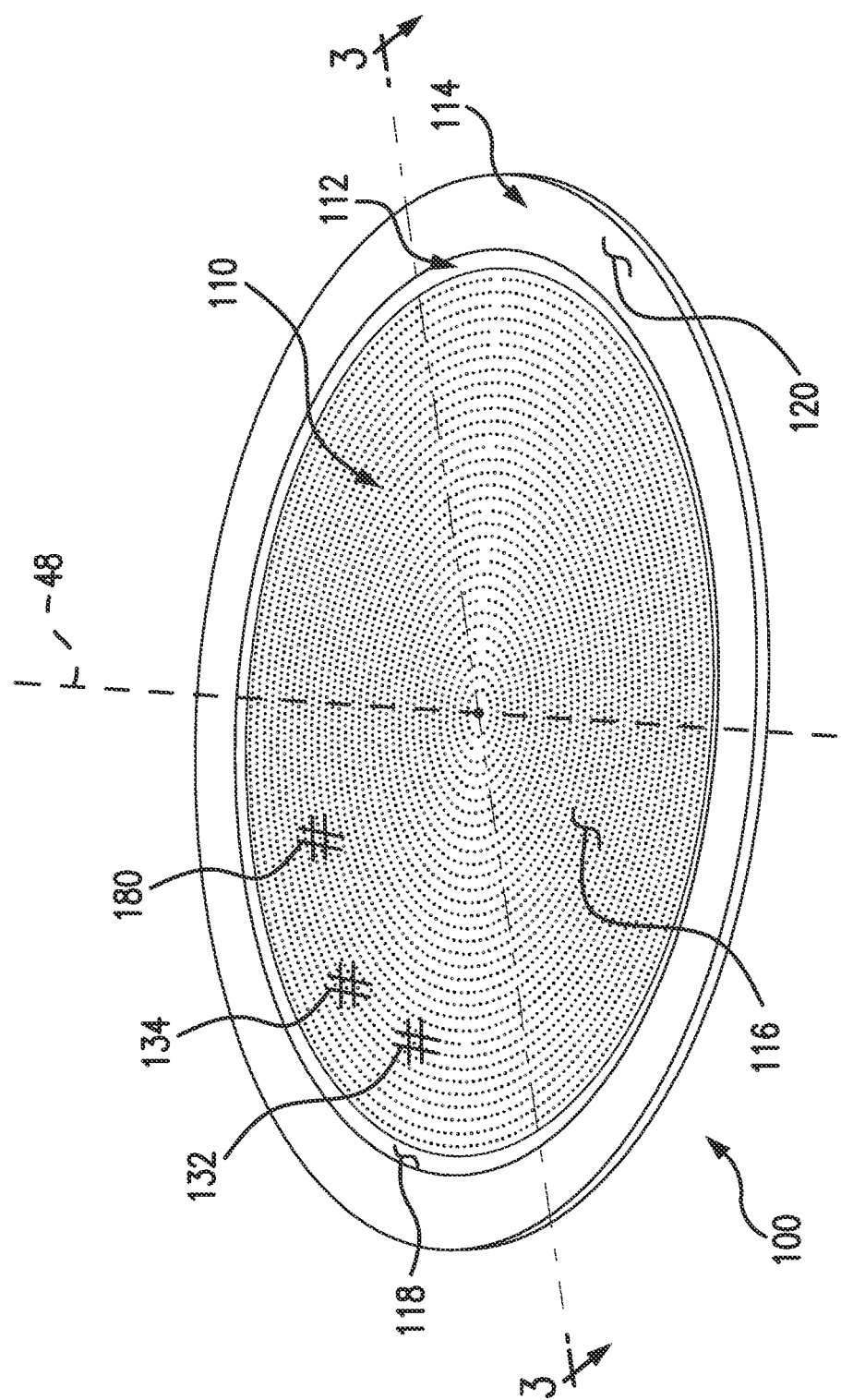
FIG. 2 is a perspective view of the susceptor of FIG. 1, showing a circular pocket portion connected to a radially outer annular rim portion by a radially inner ledge portion to support the substrate during deposition of the film onto the substrate.

With reference to FIG. 2, the susceptor 100 is shown in a perspective view. The susceptor 100 has a pocket portion 110, a ledge portion 112, a rim portion 114. The pocket portion 110 is circular in shape, is arranged along the rotation axis 48, and has a perforated surface 116. The ledge portion 112 is annular in shape, extends circumferentially about the pocket portion 110, and has a ledge surface 118 that slopes axially upward in a direction radially outward from the perforated surface 116. The rim portion 114 is annular in shape, extends circumferentially about the ledge portion 112 of the susceptor 100, has a rim surface 120, and is connected to the pocket portion 110 by the ledge portion 112 of the susceptor 100.

The rim surface 120 extends radially between a radially-inner periphery 124 of the susceptor 100 and a radially-outer periphery 126 of the susceptor 100, the rim surface 120 further located axially on a side the ledge surface 118 axially opposite perforated surface 116 of the susceptor 100. The pocket portion 110 has a plurality of perforations 122 (shown in FIG. 3A) extending axially therethrough and is concave relative to the ledge portion 112 of the susceptor 100. It is contemplated that each of the plurality of perforations 122 fluidly couple the lower surface 128 (shown in FIG. 3A) of the susceptor 100 with the perforated surface 116 of the susceptor 100. As will be appreciated by those of skill in the art in view of the present disclosure, fluidly coupling the lower surface 128 of the susceptor 100 with the perforated surface 116 of the susceptor 100 fluidly couples the lower chamber 42 (shown in FIG. 1) of the reactor 16 (shown in FIG. 1) with a purged volume 130 (shown in FIG. 3A) defined between the perforated surface 116 and the substrate 14. In certain examples, the susceptor 100 may be formed from graphite 132. In accordance with certain examples, the susceptor 100 may have a silicon-containing precoat 134.

It is contemplated that the silicon-containing precoat 134 may overlay a graphite material forming the susceptor 100. It is also contemplated that the silicon-containing precoat 134 may overlay a silicon carbide 180 (shown in FIG. 2) coating encapsulating the susceptor 100. The silicon-containing precoat 134 may have a thickness that is between about 1 micron and about 3 microns.

Figure 3A:
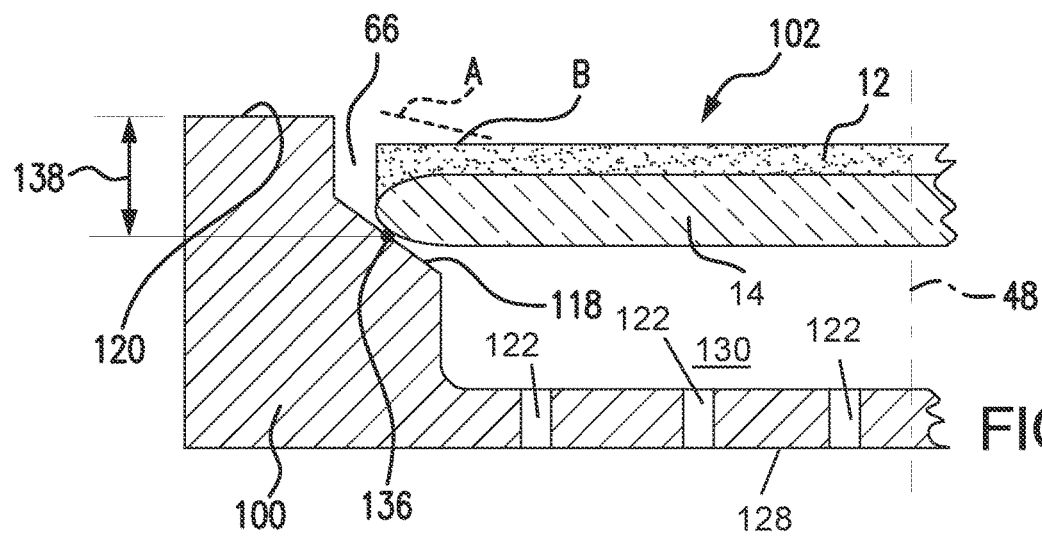
FIGS. 3A-3C are cross-sectional side views of examples of the susceptor of FIG. 1, showing tuned pockets having a flattening pocket depth, thickening pocket depth, and a thinning pocket depth of the susceptors, respectively.
Figure 3B:
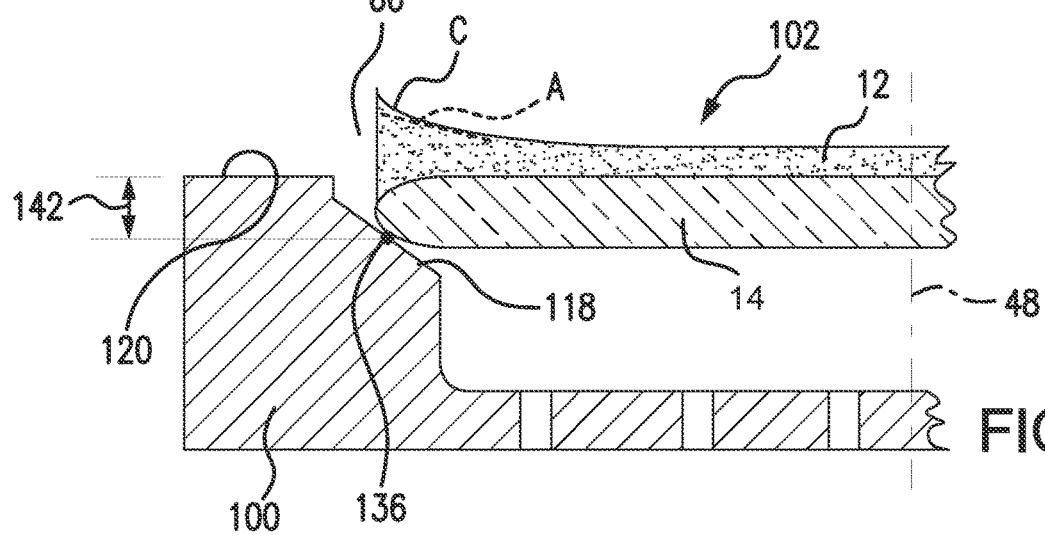
Figure 3C:
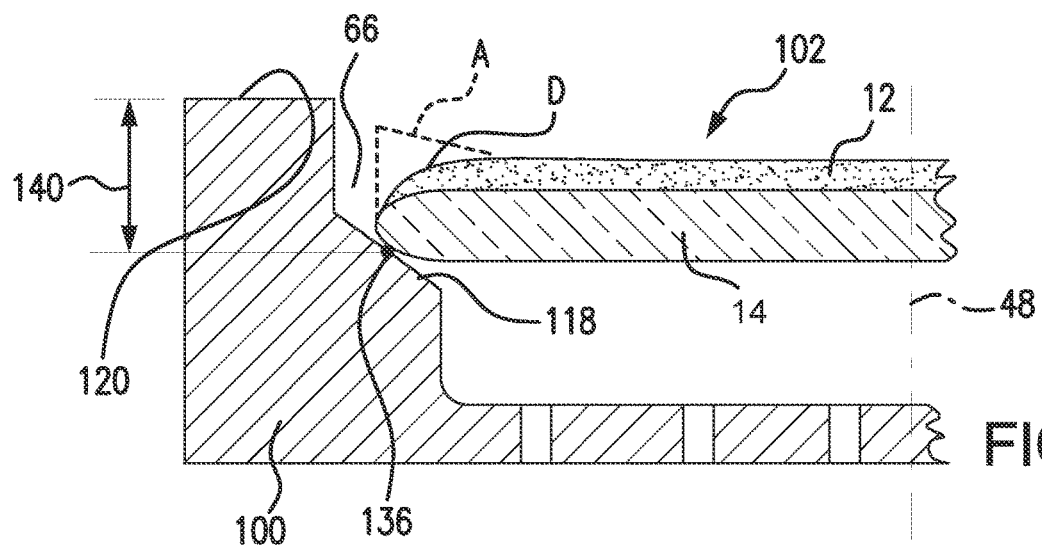

With reference to FIGS. 3A-3C, examples of the susceptor 100 are shown including the tuned pocket 102. The tuned pocket 102 is defined between the rim surface 120 of the susceptor 100 and the ledge surface 118 of the susceptor 100. More specifically, the tuned pocket 102 is defined between the rim surface 120 and a support circumference 136 located along the ledge surface 118 and radially offset from the rotation axis 48 by about one-half a diameter of the substrate 14. Specifically, the tuned pocket 102 may be one of a flattening pocket depth 138, a roll-up pocket depth 142 (shown in FIG. 3B), and a roll-down pocket depth 140 (shown in FIG. 3C). In certain examples, the support circumference 136 may extending circumferentially about the rotation axis 48. In accordance with certain examples, the support circumference 136 may have a diameter that is between about 290 millimeters and about 298 millimeters. Although described herein the context of a 300-millimeter substrate, it to be understood and appreciated that substrates having diameters smaller than 300 millimeters, e.g., 200-millimeter substrates, and substrates having diameters greater than 300 millimeters, e.g., 450-millimeter substrates, may also benefit from the present disclosure and remain within the scope of the present disclosure.

As shown in FIG. 3A, in certain examples, the susceptor 100 may define the flattening pocket depth 138. In this respect the rim surface 120 may be axially offset from the support circumference 136 to homogenize concentration of precursor within the gap 66 relative to precursor concentration at radially inner locations of the substrate 14. Homogenizing precursor recirculation within the gap 66 more closely matches the rate at which the film 12 deposits at the radially outer edge of the substrate 14 in relation to the radially inner locations of the substrate 14, flattening the edge profile of the film 12 and imparting a flattened edge thickness profile B into the film 12 relative to a nominal edge thickness profile A otherwise imparted to the film 12 during deposition of the film 12 onto the substrate 14.

In certain examples, the flattening pocket depth 138 may be greater than (deeper) the roll-up pocket depth 142 (shown in FIG. 3B) for a given deposition process. In accordance with certain examples, the flattening pocket depth 138 may be less than (shallower) the roll-down pocket depth 140 (shown in FIG. 3C) for the given deposition process. In certain examples, the flattening pocket depth 138 may be between about 0.4 millimeters and about 1.3 millimeters, or between about 0.6 millimeters and about 1.09 millimeters, or even between about 0.8 millimeters and about 1.09 millimeters. For example, the flattening pocket depth may be about 0.8 millimeters or about 1.09 millimeters. Without being bound by a particular theory or mode of operation, it is believed that pocket depths within these ranges can limit variation in edge thickness variation in relatively thick silicon-containing epitaxial films, e.g., having a mean thickness between about 40 microns and 100 microns, by generating flow conditions at the wafer edge that compensate for other factors that contribute to edge thickness variation. As will be appreciated by those of skill in the art in view of the present disclosure, limiting (or eliminating) edge roll-up can limit the likelihood that semiconductor devices formed at the periphery of a substrate (e.g., edge die adjacent bounding the wafer bevel) have similar (or substantially equivalent) electrical properties to those formed at radially inner locations, improving yield of the device fabrication process.

It is also contemplated that, in accordance with certain examples, the flattening pocket depth 138 may be selected such that the topside 56 of the substrate 14 is supported by the ledge surface 118 is arranged axially between the rim surface 120 of the rim portion 114 of the susceptor 100 and the perforated surface 116 of the pocket portion 110 of the susceptor along the rotation axis 48 when supported by the ledge surface 118 of the ledge portion 112 of the susceptor 100.

As shown in FIG. 3B, in accordance with certain examples, the susceptor 100 may define the roll-up pocket depth 142. In such examples the rim surface 120 may be axially offset from the support circumference 136 to increase precursor concentration within the gap 66 relative to recirculation induced by the flattening pocket depth 138 (shown in FIG. 138). Increasing precursor concentration within the gap 66 increases the rate of deposition at the radially outer edge of the substrate 14 relative to radially inner regions of the substrate 14, thickening the film 12 at the radially outer edge of the substrate 14. Thickening the film 12 at the radially outer edge of the substrate 14 in turn imparts a roll-up edge thickness profile C within the film 12 relative to the nominal edge thickness profile A otherwise imparted to the film 12 during deposition of the film 12 onto the substrate 14.

In certain examples, the roll-up pocket depth 142 may be less than (shallower) the flattening pocket depth 138 (shown in FIG. 3A) for the given deposition process. In accordance with certain examples, the roll-up pocket depth 142 may also be less than (shallower) the roll-up pocket depth 140 (shown in FIG. 3C) for the given deposition process. It is contemplated that, in certain examples, the roll-up pocket depth 142 may be between about 0.83 millimeters and about 1.03 millimeters. It is also contemplated that, in accordance with certain examples, the roll-up pocket depth 142 may be selected that such that the topside 56 of the substrate 14 is substantially coplanar with the rim surface 120 of the rim portion 114 of the susceptor 100 along the rotation axis 48 when supported by the ledge surface 118 of the ledge portion 112 of the susceptor 100.

As shown in FIG. 3C, it is also contemplated that, in accordance with certain examples, the susceptor 100 may define the roll-down pocket depth 140. In such examples the rim surface 120 may be axially offset from the support circumference 136 in a direction axially opposite the roll-up pocket depth 142 (shown in FIG. 3B) to decrease precursor concentration within the gap 66 relative to precursor concentration within the gap 66 otherwise induced by the flattening pocket depth 138 (shown in FIG. 3A). Decreasing precursor concentration within the gap 66 in turn imparts a roll-down edge thickness profile D within the film 12 relative to the nominal edge thickness profile A otherwise imparted to the film 12 during deposition of the film 12 onto the substrate 14.

In certain examples, the roll-down pocket depth 140 may be greater than (deeper) the roll-up pocket depth 142 (shown in FIG. 3B) for a given deposition process. In accordance with certain examples, the roll-down pocket depth 140 may also be greater than (deeper) the flattening pocket depth 138 (shown in FIG. 3A) for the given deposition process. It is contemplated that, in certain examples, the roll-down pocket depth 140 may be between about 1.13 millimeters and about 1.33 millimeters. It is also contemplated that, in accordance with certain examples, the roll-down pocket depth 140 may be selected such that the topside 56 of the substrate 14 is arranged axially between the rim surface 120 of the rim portion 114 of the susceptor 100 and the perforated surface 116 of the pocket portion 110 of the susceptor 100 when supported by the ledge surface 118 of the ledge portion 112 of the susceptor 100.

With reference to FIGS. 4A-8B, examples the susceptor 100 are shown including the contact break 104. The contact break 104 is configured to flow purge gas, e.g., the purge gas 54 (shown in FIG. 1), from within the purged volume 130 to a gap 66 (shown in FIG. 3A) defined between the periphery 60 of the substrate 14 and the radially-inner periphery 124 of the rim portion 114 of the susceptor 100. It is contemplated that the contact break 104 support the periphery 60 of the substrate 14, the periphery 60 overlying the contact break 104 and the substrate 14 thereby being discontinuously supported by the susceptor 100 by the contact break 104. In certain examples, the contact break 104 may indirectly flow the purge gas 54 radially along the ledge surface 118, e.g., through tortuous flow path defined axially between the underside 58 of the substrate 14 and the ledge surface 118 by roughness of the ledge surface 118. In accordance with certain examples, the contact break 104 may define a direct flow path, e.g., via radially-extending flow area within a purge slot or a grid structure, axially between the ledge surface 118 and the underside 58 of the substrate 14.

Without being limited to a particular theory, it is believed flowing the purge gas 54 into the gap 66 from the purged volume 130 displaces precursor, e.g., the first precursor 50 (shown in FIG. 1) and/or the second precursor 52 (shown in FIG. 1), from within the gap 66. Displacing precursor from within the gap 66 in turn reduces precursor concentration within the gap 66, limiting (or preventing) the development of bridging between the substrate 14 and the susceptor 100 according to flow rate of the purge gas 54 between the ledge surface 118 and the periphery of the substrate 14 through the contact break 104. Flow rate of the purge gas 54 through the contact break 104 is in turn determined at least in part by the arrangement of the contact break 104.

Figure 4A:
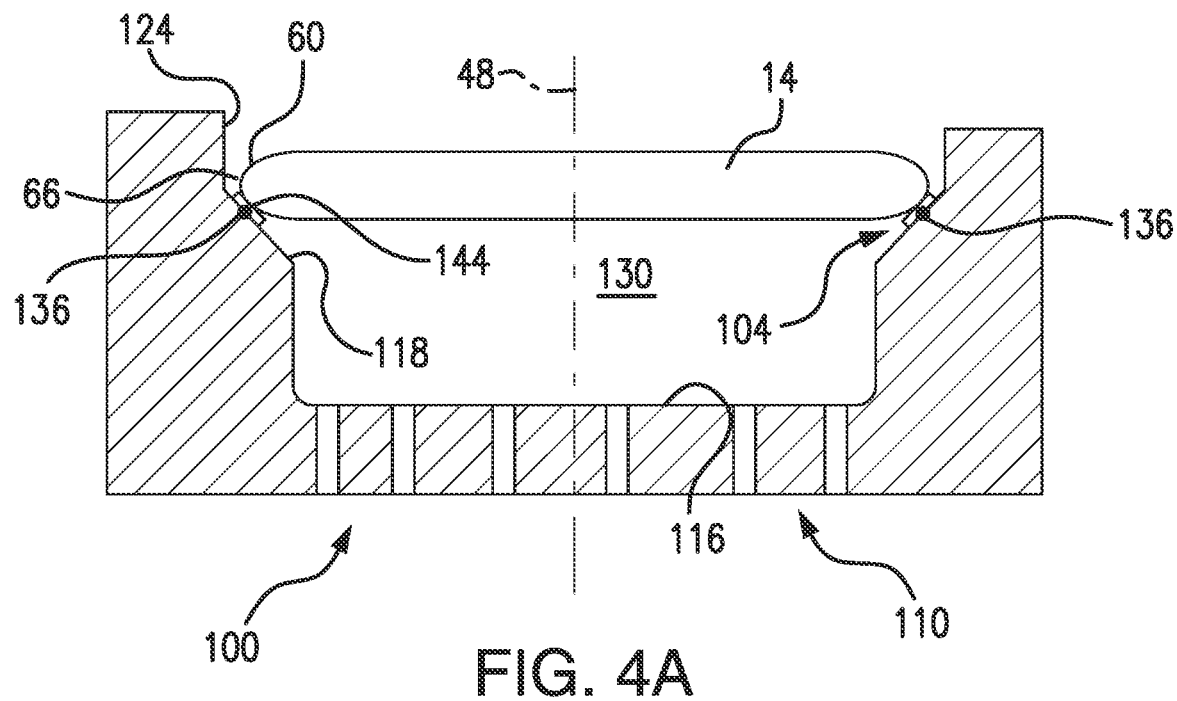
FIGS. 4A-8B are cross-sectional side views of examples of the susceptor of FIG. 1, showing susceptors with contact breaks located on the ledge surface of the susceptor and underlying the periphery of the substrate.
Figure 4B:
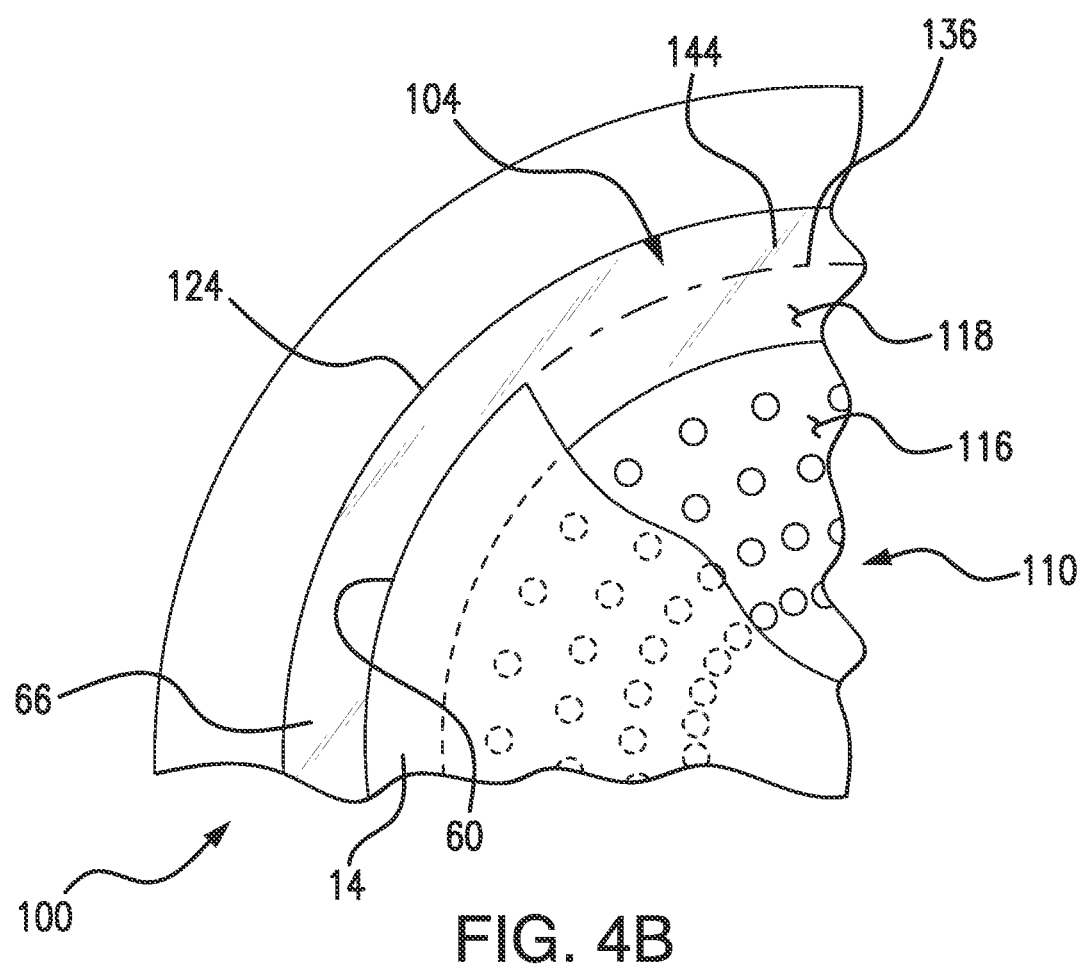

As shown in FIGS. 4A and 4B, the contact break 104 may include an unpolished region 144. In such examples the unpolished region 144 forms at least a portion of the ledge surface 118 and is located radially between the perforated surface 116 and the radially-inner periphery 124 of the susceptor 100. More specifically, the unpolished region 144 may be located axially between the perforated surface 116 and the periphery 60 of the substrate 14, e.g., such that the unpolished region 144 radially traverses the support circumference 136 of the susceptor 100. As will be appreciated by those of skill in the art in view of the present disclosure, locating the unpolished region 144 axially between the ledge surface 118 and the periphery 60 of the substrate 14 allows the purge gas 54 (shown in FIG. 1) to flow from the purged volume 130 to the gap 66 at a rate determined by roughness of the unpolished region 144.

In certain examples, the unpolished region 144 may be located radially along the ledge surface 118 between the perforated surface 116 and the radially-inner periphery 124 of the susceptor 100. In accordance with certain examples, the unpolished region 144 may extend radially outward from the perforated surface 116 of the susceptor 100. It is also contemplated that, in certain examples, the unpolished region 144 may extend radially inward from the radially-inner periphery 124 of susceptor 100. It is further contemplated that, in accordance with certain examples, that the unpolished region 144 may extend continuously along the ledge surface 118 and about the pocket portion 110 of the susceptor 100.

In certain examples, the unpolished region 144 may have a roughness that is between about 0.2 microns and about 5.0 microns, or between about 0.5 microns and about 5.0 microns, or between about 0.8 microns and about 5.0 microns. It is also contemplated that, in accordance with certain examples, the unpolished region 144 may have roughness that is even greater than about 5.0 microns. For example, the susceptor 100 may be formed by accepting the native roughness of the material forming the ledge surface 118, e.g., by applying the silicon-containing precoat 134 to the graphite 132 (or silicon-carbide coating) in an unpolished condition, simplifying manufacture of the susceptor 100. As will be appreciated by those of skill in the art in view of the present disclosure, the unpolished region 144 allows the periphery 60 of the substrate 14 to overlay the unpolished region 144 and thereby be discontinuously supported by the susceptor 100 by the unpolished region 144.

Figure 5A:
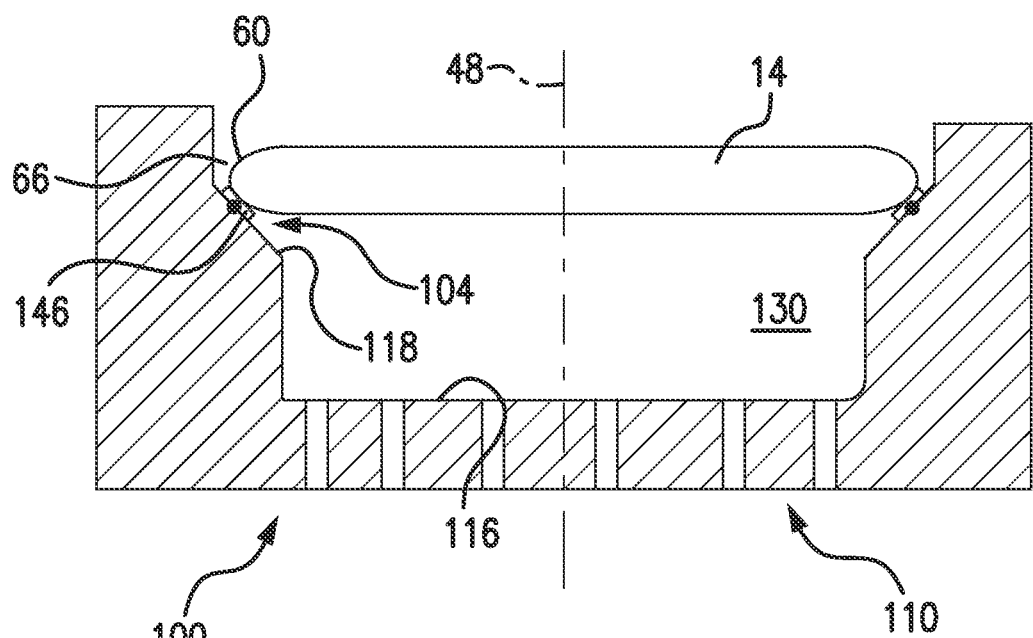
Figure 5B:
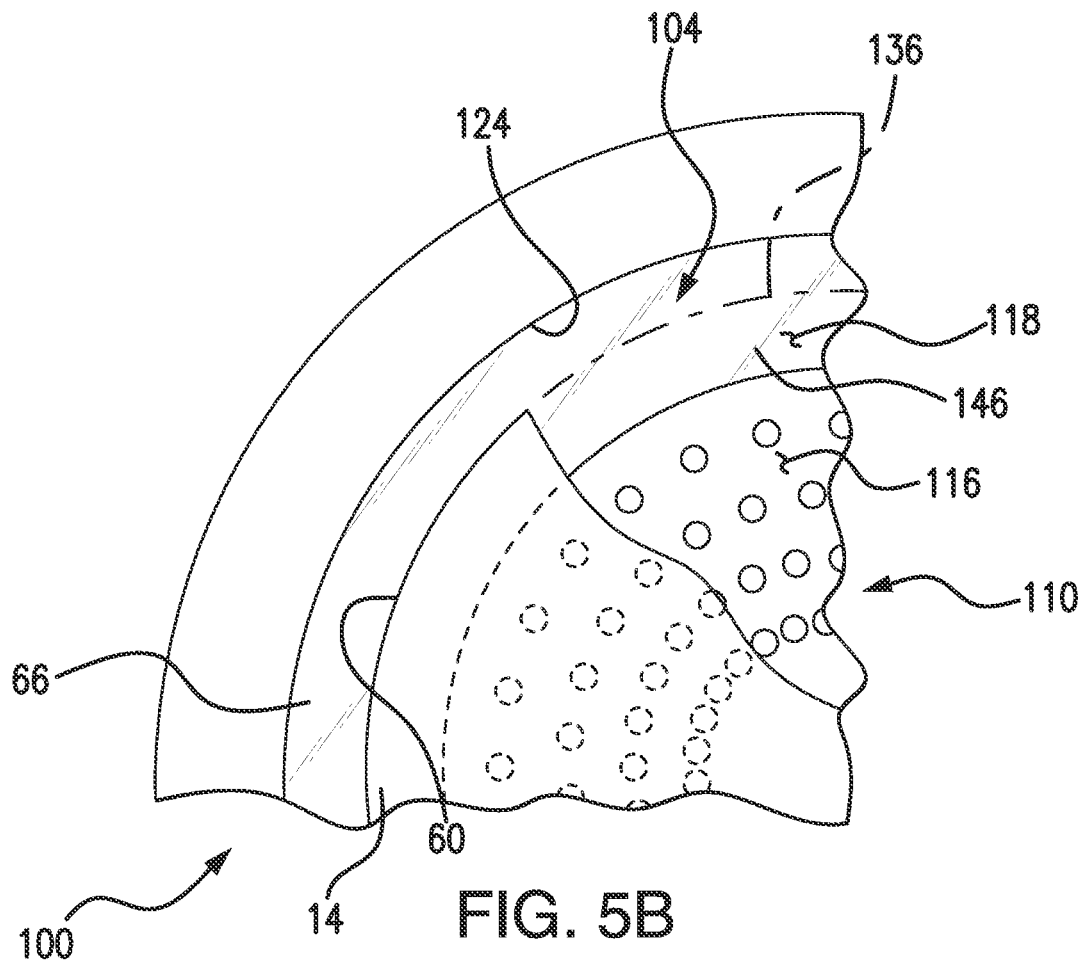

As shown in FIGS. 5A and 5B, the contact break 104 may include a partially polished region 146. In such examples, the partially polished region 146 may form at least a portion of the ledge surface 118 and may be located radially between the perforated surface 116 and the radially-inner periphery 124 of the susceptor 100. More specifically, the partially polished region 146 may be located axially between the ledge surface 118 and the periphery 60 of the substrate 14, e.g., such that the partially polished region 146 radially traverses the support circumference 136. As will be appreciated by those of skill in the art in view of the present disclosure, locating the partially polished region 146 axially between the ledge surface 118 and the periphery 60 of the substrate 14 allows the purge gas 54 (shown in FIG. 1) to flow from the purged volume 130 to the gap 66 at a rate determined by roughness of the partially polished region 146 imparted by the polishing operation used to polish the ledge surface 118. In certain examples the partially polished region 146 may have a roughness that is between about 0.2 microns and about 5.0 microns, or between about 0.5 microns and about 5.0 microns, or between about 0.8 microns and about 5.0 microns.

In certain examples, the partially polished region 146 is located radially along the ledge surface 118 between the perforated surface 116 and the radially-inner periphery 124 of the susceptor 100. In accordance with certain examples, the partially polished region 146 may extend radially outward from the perforated surface 116 of the susceptor 100. It is contemplated that, in certain examples, the partially polished region 146 may extend radially inward from the radially-inner periphery 124 of susceptor 100. It is also contemplated that, in accordance with certain examples, the partially polished region 146 may extend continuously along the ledge surface 118 and about the pocket portion 110 of the susceptor 100. In certain examples the susceptor 100 may be formed by limiting the extent to which the ledge surface 118 is typically polished, e.g., ceasing polishing prior to reaching a roughness of about 0.2 microns, the partially polished region 146 simplifying manufacture of the susceptor 100 as well as limiting (or preventing) bridging between the substrate 14 and the susceptor 100. As will be appreciated by those of skill in the art in view of the present disclosure, the partially polished region 146 allows the periphery 60 of the substrate 14 to overlay the partially polished region 146 and thereby be discontinuously supported by the susceptor 100 by the partially polished region 146.

Figure 6A:
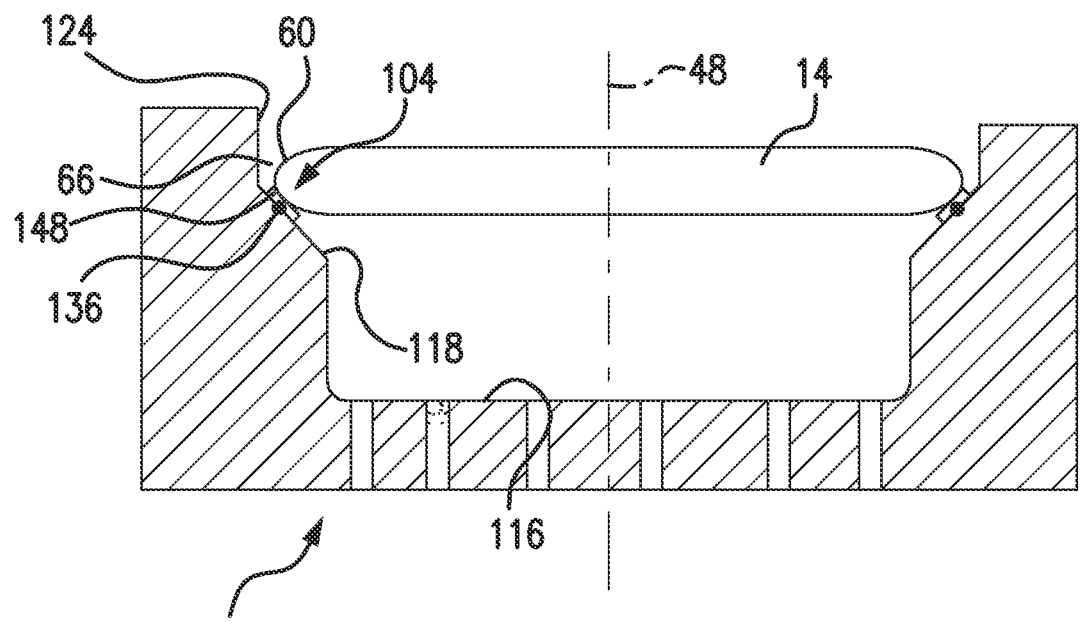
Figure 6B:
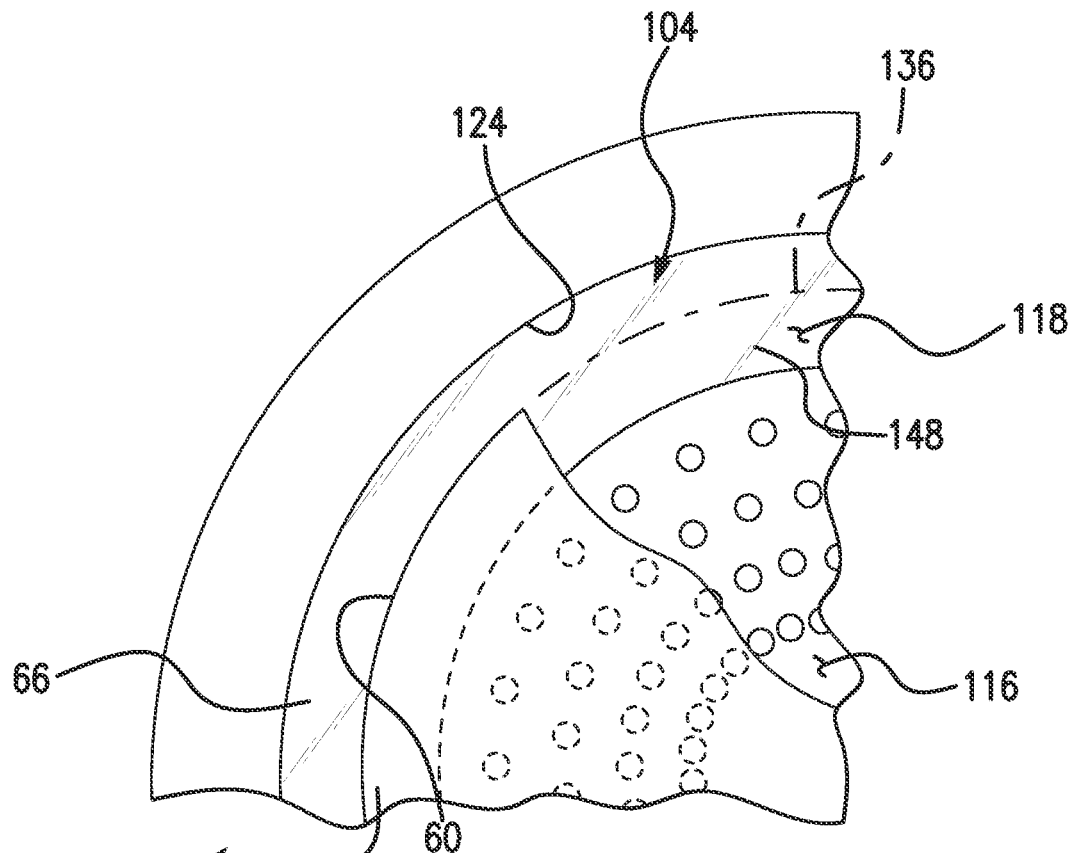

As shown in FIGS. 6A and 6B, the contact break 104 may include a roughened region 148. In such examples the roughened region 148 may form at least a portion of the ledge surface 118 and may be located radially between the radially-inner periphery 124 and the radially-outer periphery 126 of the susceptor 100. More specifically, the roughened region 148 may be located axially between the ledge surface 118 and the periphery 60 of the substrate 14, e.g., such that the roughened region 148 radially traverses the support circumference 136. As will be appreciated by those of skill in the art in view of the present disclosure, locating the roughened region 148 axially between the ledge surface 118 and the periphery 60 of the substrate 14 allows the purge gas 54 (shown in FIG. 1) to flow from the purged volume 130 to the gap 66 at a rate determined by roughness of the roughened region 148 by a roughening operation applied to the ledge surface 118. In certain examples the roughened region 148 may have a roughness that is between about 0.5 microns and about 2.0 microns, or between about 0.5 microns and about 5.0 microns, or between about 0.8 microns and about 5.0 microns.

In certain examples, the roughened region 148 is located radially along the ledge surface 118 between the perforated surface 116 and the radially-inner periphery 124 of the susceptor 100. In accordance with certain examples, the roughened region 148 may extend radially outward from the perforated surface 116 of the susceptor 100. It is contemplated that, in certain examples, the roughened region 148 may extend radially inward from the radially-inner periphery 124 of susceptor 100. It is also contemplated that, in accordance with certain examples, the roughened region 148 may extend continuously along the ledge surface 118 and about the pocket portion 110 of the susceptor 100. In certain examples the susceptor 100 may be formed by roughening the ledge surface 118 subsequent to polishing the ledge surface 118, e.g., by reworking a ledge surface that was excessively polished or by refurbishing a susceptor having a polished ledge surface, the reworked or refurbished susceptor 100 thereby limiting (or preventing) bridging between the substrate 14 and the susceptor 100. As will be appreciated by those of skill in the art in view of the present disclosure, the roughened region 148 allows the periphery 60 of the substrate 14 to overlay the roughened region 148 and thereby be discontinuously supported by the susceptor 100 by the roughened region 148.

The roughened region may be formed, for example, by cyclically etching and depositing a film onto the ledge surface 118 of the susceptor 100 without a substrate supported by the susceptor 100. In this respect cyclically etching and depositing a film onto the ledge surface 118 of the susceptor 100 may include cyclically (a) etching the ledge surface 118 with a mixture of hydrochloric acid (HCl) and hydrogen ($H_2$) gas, and (b) thereafter depositing a silicon layer onto the ledge surface 118. In further respect, cyclically etching and depositing the film onto the ledge surface 118 of the susceptor 100 may include, in aggregate, (a) etching the ledge surface 118 for more than 1000 minutes, and (b) depositing more than 4000 microns of film onto the ledge surface 118.

Figure 7A:
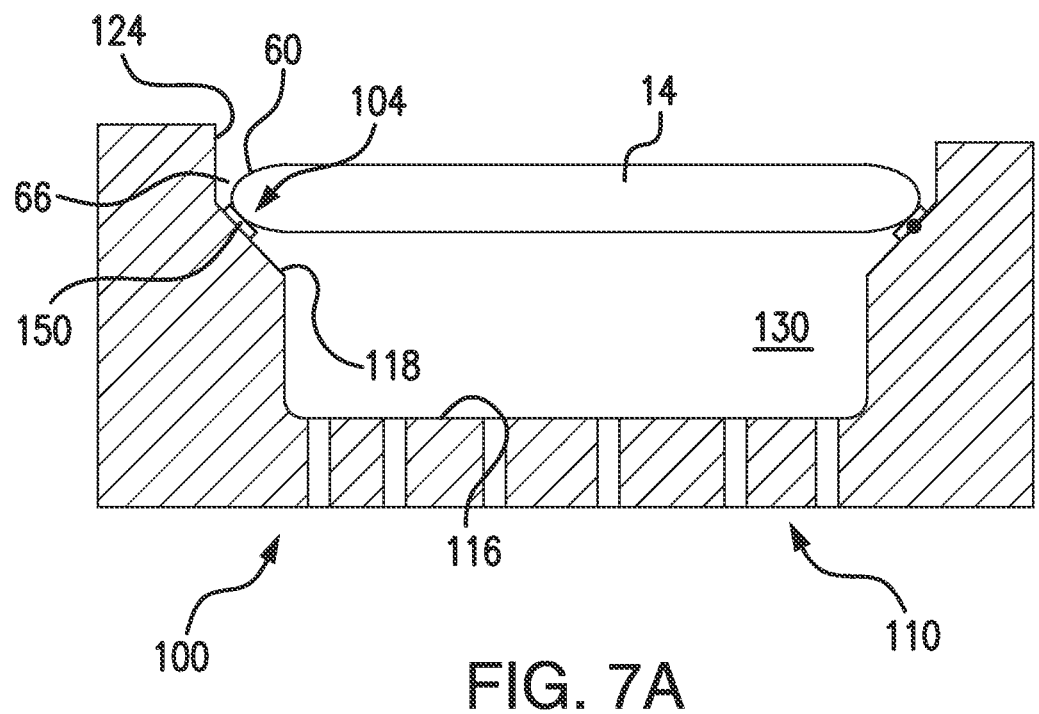
Figure 7B:
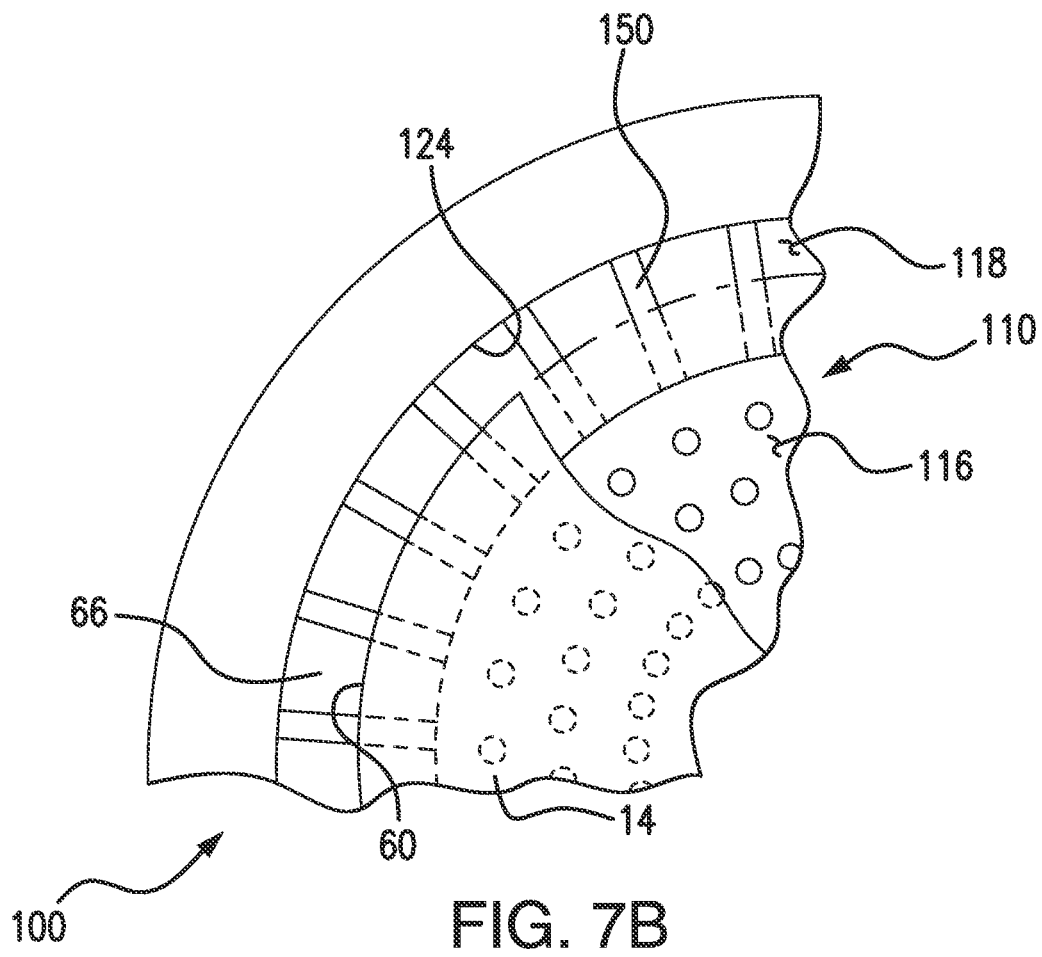

As shown in FIGS. 7A and 7B, the contact break 104 may include a purge slot 150. In such examples the purge slot 150 is defined in the ledge surface 118 at a location axially between the periphery 60 of the substrate 14 and the perforated surface 116. It is contemplated that the purge slot 150 fluidly couple the purged volume 130 directly to the gap 66. In certain examples, the purge slot 150 is located radially along the ledge surface 118 between the perforated surface 116 and the radially-inner periphery 124 of the susceptor 100. In accordance with certain examples, the purge slot 150 may extend radially outward from the perforated surface 116 of the susceptor 100. It is contemplated that, in certain examples, the purge slot 150 may extend radially inward from the radially-inner periphery 124 of susceptor 100. It is also contemplated that, in accordance with certain examples, the purge slot 150 may be one of plurality of purge slots 150 defined by the ledge surface 118 and distributed about the pocket portion 110 of the susceptor 100. As will be appreciated by those of skill in the art in view of the present disclosure, the purge slot 150 allows the periphery 60 of the substrate 14 to overlay the purge slot 150 and thereby be discontinuously supported by the susceptor 100 by a portion of the rim surface 118 defining the purge slot 150.

As will be appreciated by those of skill in the art in view of the present disclosure, defining the purge slot 150 axially between the ledge surface 118 and the periphery 60 of the substrate 14 allows the purge gas 54 (shown in FIG. 1) to flow from the purged volume 130 to the gap 66 at a rate determined by flow area of the purge slot 150. In certain examples the purge slot 150 may be one of a plurality of purge slots 150 defined in the ledge surface 118 and distributed about the pocket portion 110 of the susceptor 100. In accordance with certain examples, the plurality of purge slots 150 may be evenly distributed about pocket portion 110 of the susceptor 100, the plurality of purge slots 150 thereby evenly reducing concentration of the precursor within the gap 66 by distributing the purge gas 54 (shown in FIG. 1) about the periphery 60 of the substrate 14 and within the gap 66.

Figure 8A:
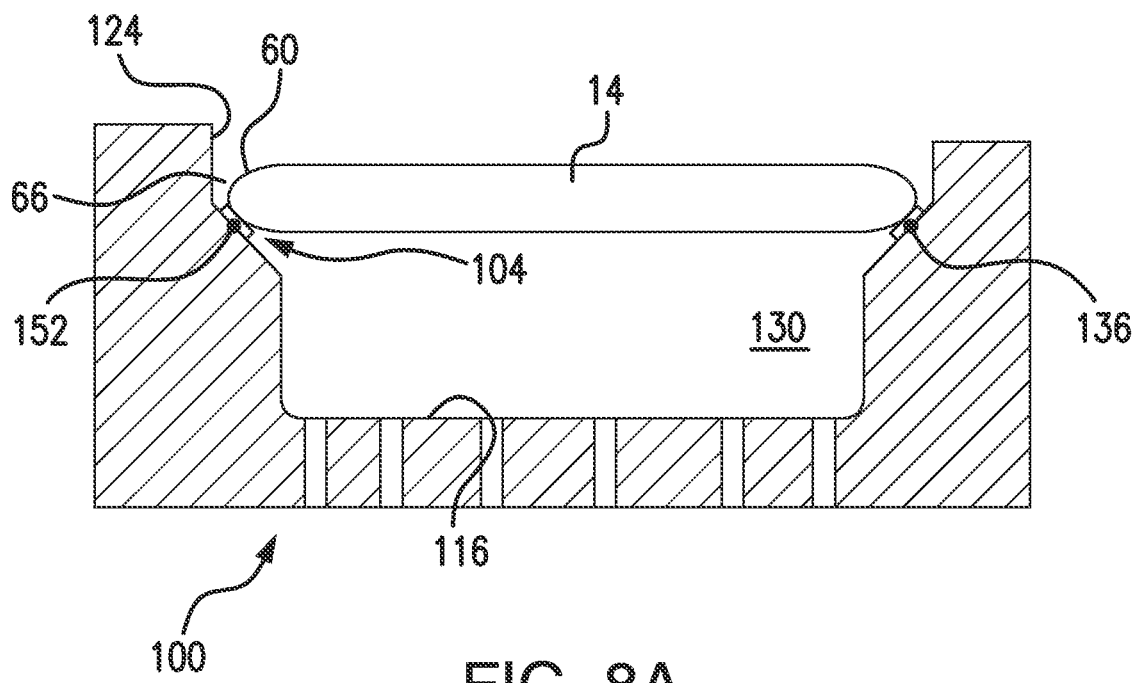
Figure 8B:
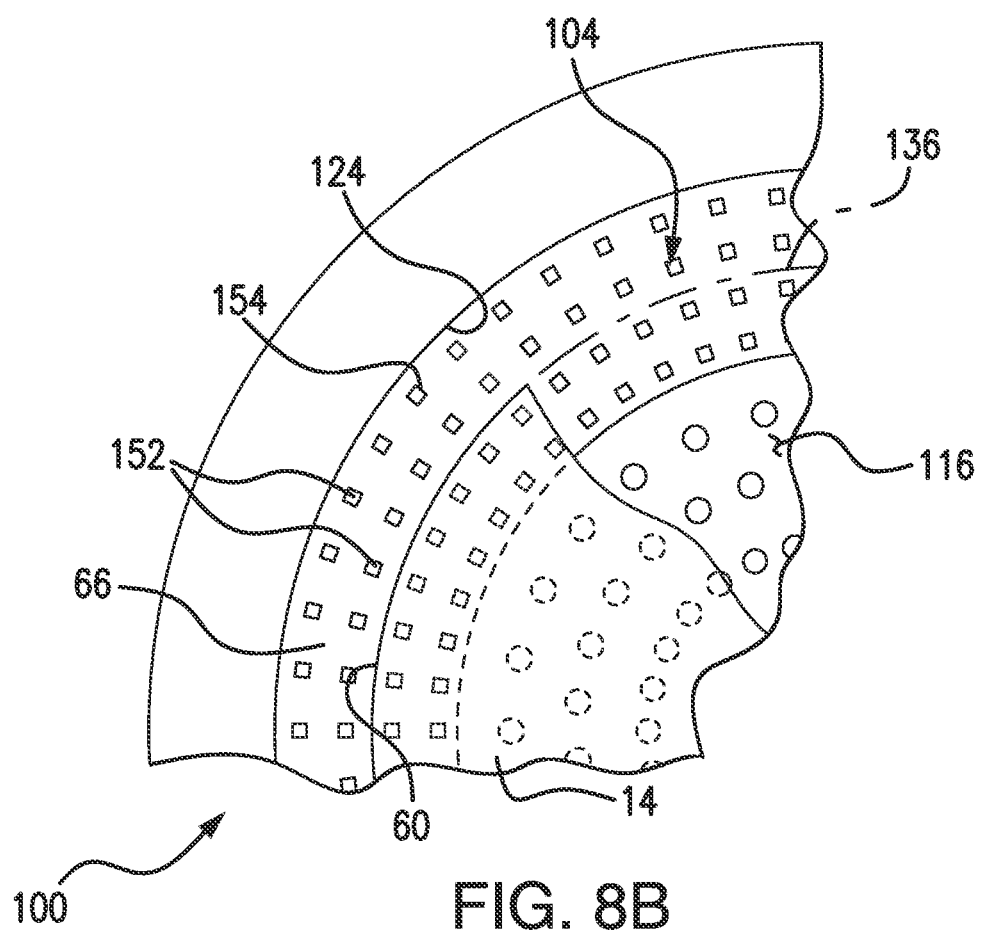

As shown in FIGS. 8A and 8B, the contact break 104 may include a grid structure 152. In such examples the grid structure 152 is defined in the ledge surface 118, e.g., using a scribing or milling operation of the graphite 132 (shown in FIG. 2) forming the susceptor 100, at a location axially between the periphery 60 of the substrate 14 and the ledge surface 118. It is contemplated that the grid structure 152 fluidly couple the purged volume 130 directly to the gap 66. In certain examples, the grid structure 152 include a plurality of teeth 154 distributed radially along the ledge surface 118 between the perforated surface 116 and the radially-inner periphery 124 of the susceptor 100. In accordance with certain examples, the grid structure 152 may extend radially outward from the perforated surface 116 of the susceptor 100. It is contemplated that, in certain examples, the grid structure 152 may extend radially inward from the radially-inner periphery 124 of susceptor 100. It is also contemplated that, in accordance with certain examples, the grid structure 152 may extend continuously along the ledge surface 118 and about the pocket portion 110 of the susceptor 100. As will be appreciated by those of skill in the art in view of the present disclosure, the grid structure 152 allows the periphery 60 of the substrate 14 to overlay the grid structure 152 and thereby be discontinuously supported by the susceptor 100 by the grid structure 152.

As will be appreciated by those of skill in the art in view of the present disclosure, defining the grid structure 152 axially between the ledge surface 118 and the periphery 60 of the substrate 14 allows the purge gas 54 (shown in FIG. 1) to flow from the purged volume 130 to the gap 66 at a rate determined by flow area defined between the teeth 154. In certain examples the teeth 154 of the grid structure 152 may be defined on the ledge surface 118 and distributed about the pocket portion 110 of the susceptor 100. In accordance with certain examples, the teeth 154 of the grid structure 152 may be evenly distributed about pocket portion 110 of the susceptor 100, the grid structure 152 thereby evenly reducing concentration of the precursor within the gap 66 by distributing the purge gas 54 (shown in FIG. 1) about the periphery 60 of the substrate 14 and within the gap 66.

With reference to FIGS. 9A-13B, examples the susceptor 100 with precursor vents, e.g., the precursor 106 (shown in FIG. 1), are shown. The precursor vent array 106 is configured to vent precursor, e.g., the first precursor 50 (shown in FIG. 1) and/or the second precursor 52 (shown in FIG. 1), from within the gap 66 (shown in FIG. 3A) defined between the periphery 60 of the substrate 14 and the radially-inner periphery 124 of the rim portion 114 of the susceptor 100. Without being limited to a particular theory, it is believed that venting precursor from within the gap 66 reduces the tendency of the precursor to recirculate (and/or concentrate) within gap 66, limiting (or preventing) bridging between the substrate 14 and the susceptor 100. In certain examples the precursor vent array 106 may cooperate with the contact break 104 by drawing the purge gas 54 from the purged volume 130, through the contact break 104, and into the gap 66. Once in the gap 66 the purge gas 54 displaces precursor, reducing precursor concentration of precursor within the gap 66.

Figure 9A:
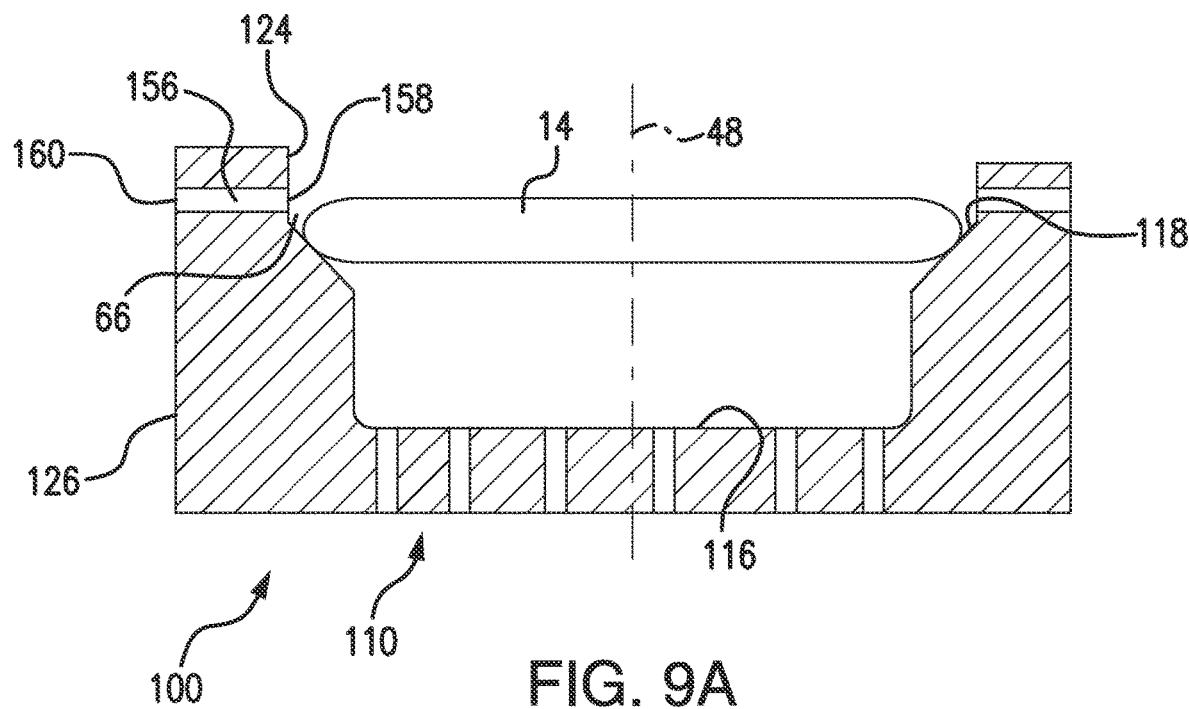
FIGS. 9A-12B are cross-sectional side views of further examples of the susceptor of FIG. 1, showing susceptors with precursor vents extending through the susceptor at locations radially outward of the pocket portion of the susceptor.
Figure 9B:
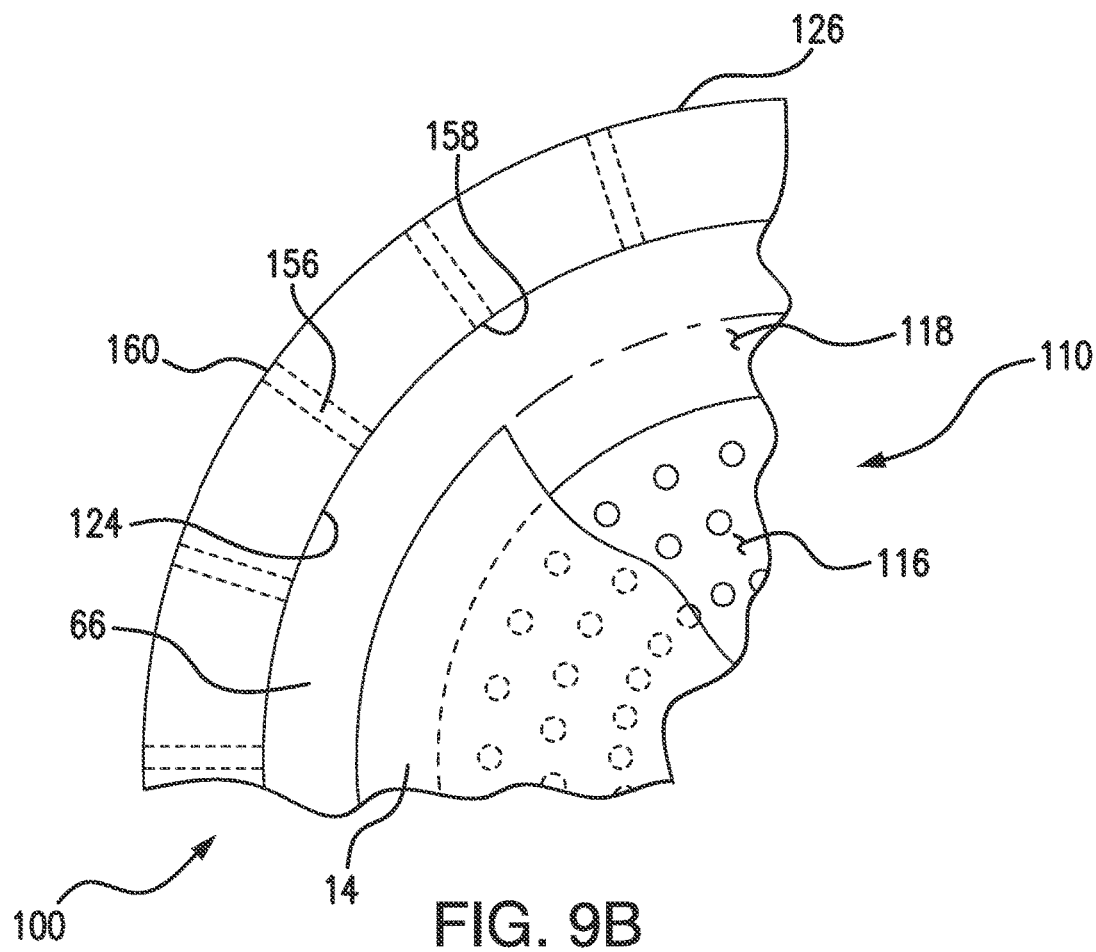

As shown in FIGS. 9A and 9B, the precursor vent array 106 may include a radial vent 156. In such examples the radial vent 156 has a radial vent inlet 158 and a radial vent outlet 160. The radial vent inlet 158 is located on the radially-inner periphery 124 of the susceptor 100, the radial vent outlet 160 is located on the radially-outer periphery 126 of the susceptor 100, and the radial vent 156 fluidly couples the radial vent inlet 158 to the radial vent outlet 160 to vent precursor from the gap 66 to the radially-outer periphery 126 of the susceptor 100. In the illustrated example the radial vent outlet 160 is located axially between the ledge surface 118 and the perforated surface 116, the radial vent 156 thereby issuing vented precursor into the upper chamber 40 (shown in FIG. 1) of the reactor 16 (shown in FIG. 1). In the illustrated example, the radial vent 156 is orthogonal relative to the rotation axis 48. As will be appreciated by those of skill in the art in view of the present disclosure, venting precursor into the upper chamber 40 allows flow through the radial vent 156 to be controlled by pressure within the upper chamber 40 of the reactor 16.

In certain examples, the radial vent 156 may be one of a plurality of radial vents 156. In accordance with certain examples, the plurality of radial vents 156 be distributed circumferentially about the pocket portion 110 of the susceptor 100. In accordance with certain examples, the plurality of radial vents 156 may be distributed evenly about the pocket portion 110 of the susceptor 100 to provide uniform venting precursor from within the gap 66. Although a certain number of radial vents 156 are shown in the illustrated example, it is to be understood and appreciated the susceptor 100 may have a greater number of radial vents 156 or a fewer number of radial vents 156 than shown in FIGS. 9A and 9B and remain within the scope of the present disclosure.

Figure 10A:
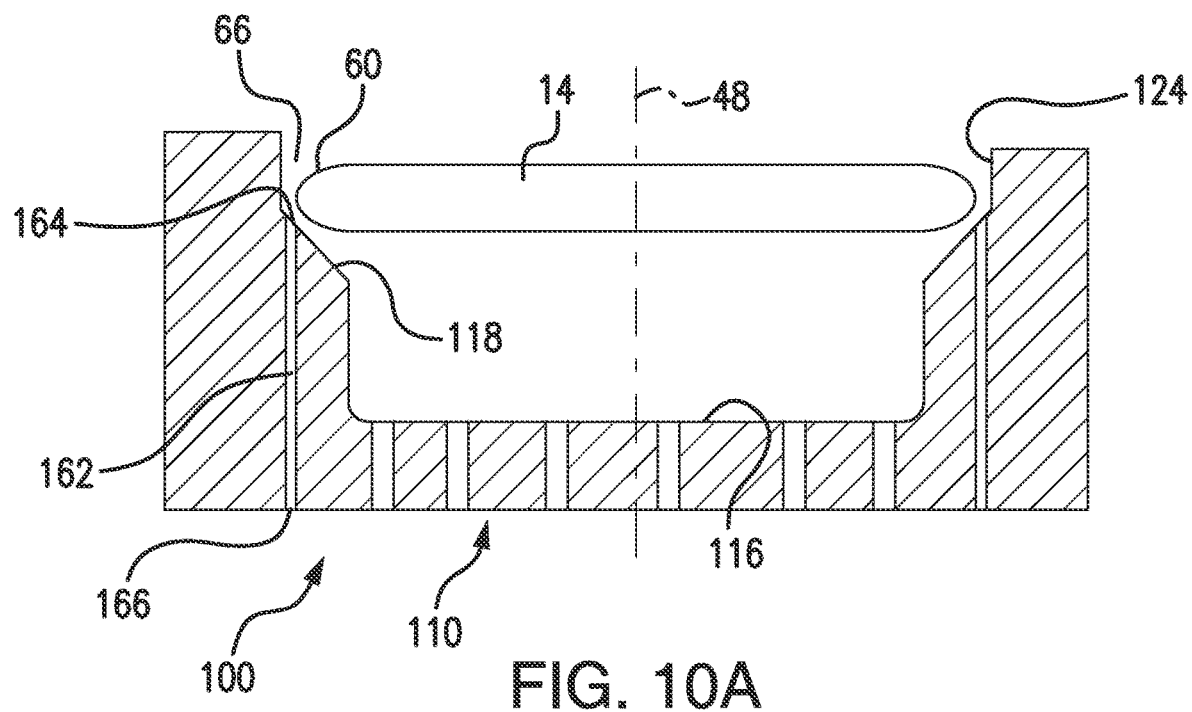
Figure 10B:
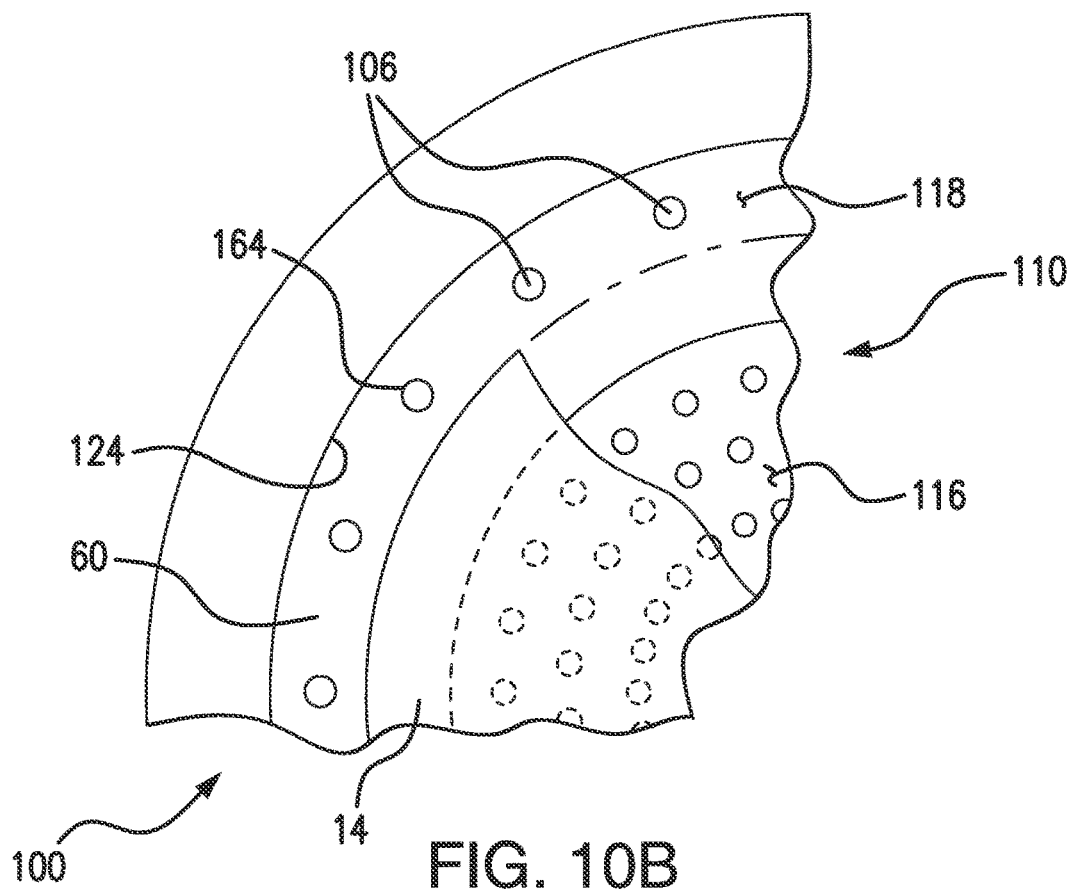

As shown in FIGS. 10A and 10B, the precursor vent array 106 may include an axial vent 162. In such examples the axial vent 162 has an axial vent inlet 164 and an axial vent outlet 166. The axial vent inlet 164 is located on the ledge surface 118 of the susceptor 100. More specifically, the axial vent inlet 164 is located radially between the perforated surface 116 and radially-inner periphery 124 of the susceptor 100. Specifically, the axial vent inlet 164 is located radially outward of the periphery 60 of the substrate 14, e.g., at a distance greater than about 152 millimeters from the rotation axis 48, such that the axial vent inlet 164 is located radially between the periphery 60 and the radially-inner periphery 124 of the susceptor 100.

The axial vent outlet 166 is located on the lower surface 128 of the susceptor 100 and is fluidly coupled to the axial vent inlet 164 by the axial vent 162. In this respect the axial vent outlet 166 is located on a side of the perforated surface 116 axially opposite the ledge surface 118, the axial vent 162 thereby issuing vented precursor into the lower chamber 42 (shown in FIG. 1) of the reactor 16 (shown in FIG. 1). In the illustrated example the axial vent 162 is substantially parallel relative to the rotation axis 48. As will be appreciated by those of skill in the art in view of the present disclosure, venting precursor into the lower chamber 42 allows flow through the axial vent 162 to be controlled by pressure within the lower chamber 42 of the reactor 16.

In certain examples, the axial vent 162 may be one of a plurality of axial vents 162. In accordance with certain examples, the plurality of axial vents 162 may be distributed circumferentially about the pocket portion 110 of the susceptor 100. In accordance with certain examples, the plurality of axial vents 162 may be distributed evenly about the pocket portion 110 of the susceptor 100 to provide uniform venting precursor from within the gap 66. Although a certain number of axial vents 162 vents are shown in the illustrated example, it is to be understood and appreciated the susceptor 100 may have a greater number of axial vents 162 or a fewer number of axial vents 162 than shown in FIGS. 10A and 10B and remain within the scope of the present disclosure.

Figure 11A:
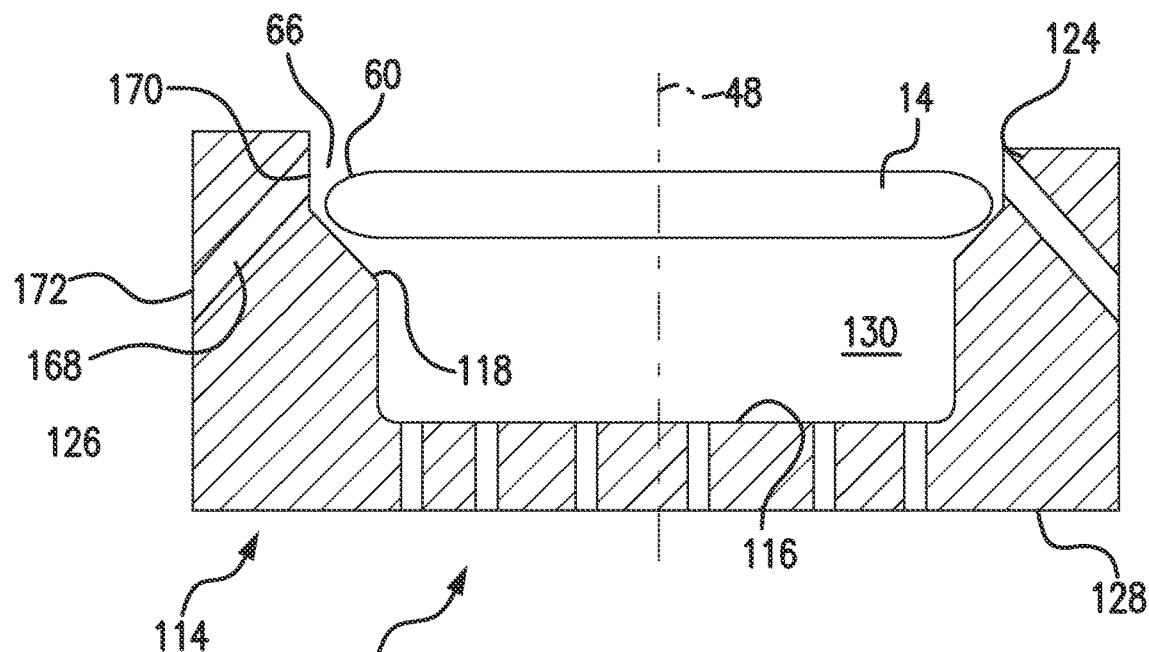
Figure 11B:
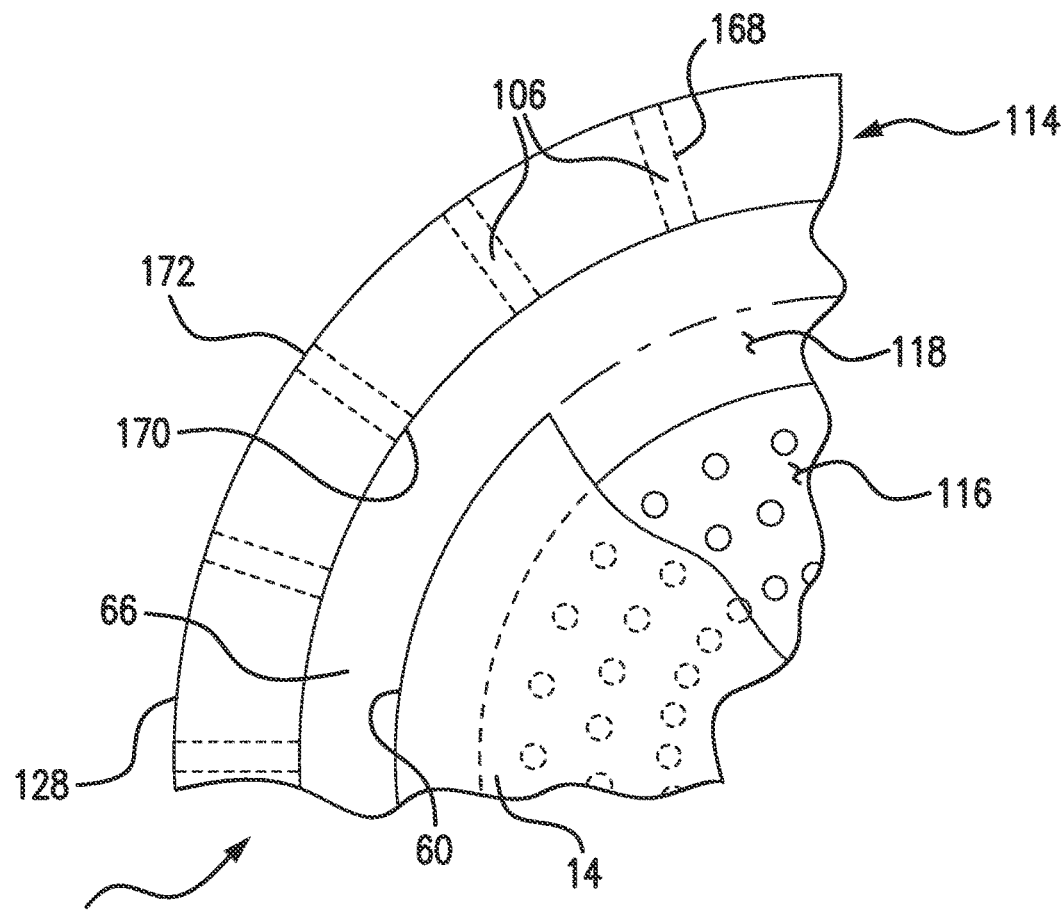

As shown in FIGS. 11A and 11B, the precursor vent array 106 may include one or more oblique vent 168. The oblique vent 168 has an oblique vent inlet 170 and an oblique vent outlet 172. The oblique vent inlet 170 is located on the radially inner periphery 124 of the susceptor 100. More specifically, the oblique vent inlet 170 is located radially between the ledge surface 118 and the rim surface 120 of the susceptor 100. Specifically, the oblique vent inlet 170 is located radially outward of the support circumference 136 and on side of the ledge surface 118 axially opposite the perforated surface 116 of the susceptor 100.

The oblique vent outlet 172 is located on the radially-outer periphery 126 of the susceptor 100, is fluidly coupled to the oblique vent inlet 170 by the oblique vent 168, and extends obliquely through the rim portion 114 of the susceptor 100 relative to the rotation axis 48. More specifically, the oblique vent outlet 172 is located on the radially-outer-periphery 126 at a location axially between the ledge surface 118 and lower surface 128 of the susceptor 100. Specifically, the oblique vent outlet 172 is located on the radially-outer periphery 126 axially between the ledge surface 118 and the perforated surface 116 of the susceptor 100. As will be appreciated by those of skill in the art in view of the present disclosure, locating the oblique vent outlet 172 axially between the ledge surface 118 and the lower surface 128 allows the oblique vent 168 to vent precursor from the gap 66 to the divider aperture 34 (shown in FIG. 1), flow of the vented precursor thereby controlled by pressure differential between the lower chamber 42 (shown in FIG. 1) and the upper chamber 40 (shown in FIG. 1) of the reactor 16 (shown in FIG. 1).

In certain examples, the oblique vent 168 may be one of a plurality of oblique vents 168. In accordance with certain examples, the plurality of oblique vents 168 may be distributed circumferentially about the pocket portion 110 of the susceptor 100. In accordance with certain examples, the plurality of oblique vents 168 may be distributed evenly about the pocket portion 110 of the susceptor 100, the plurality of oblique vents 168 thereby providing uniform venting precursor from within the gap 66. Although a certain number of oblique vents 168 vents are shown in the illustrated example, it is to be understood and appreciated the susceptor 100 may have a greater number of oblique vents 168 or a fewer number of oblique vents 168 than shown in FIGS. 11A and 11B and remain within the scope of the present disclosure.

Figure 12A:
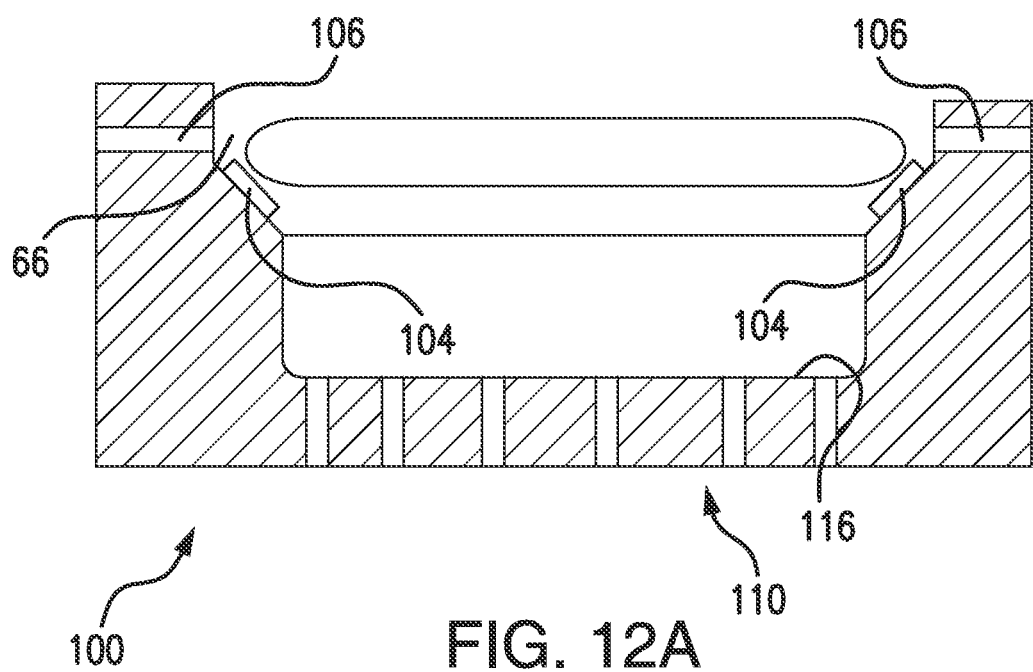
Figure 12B:
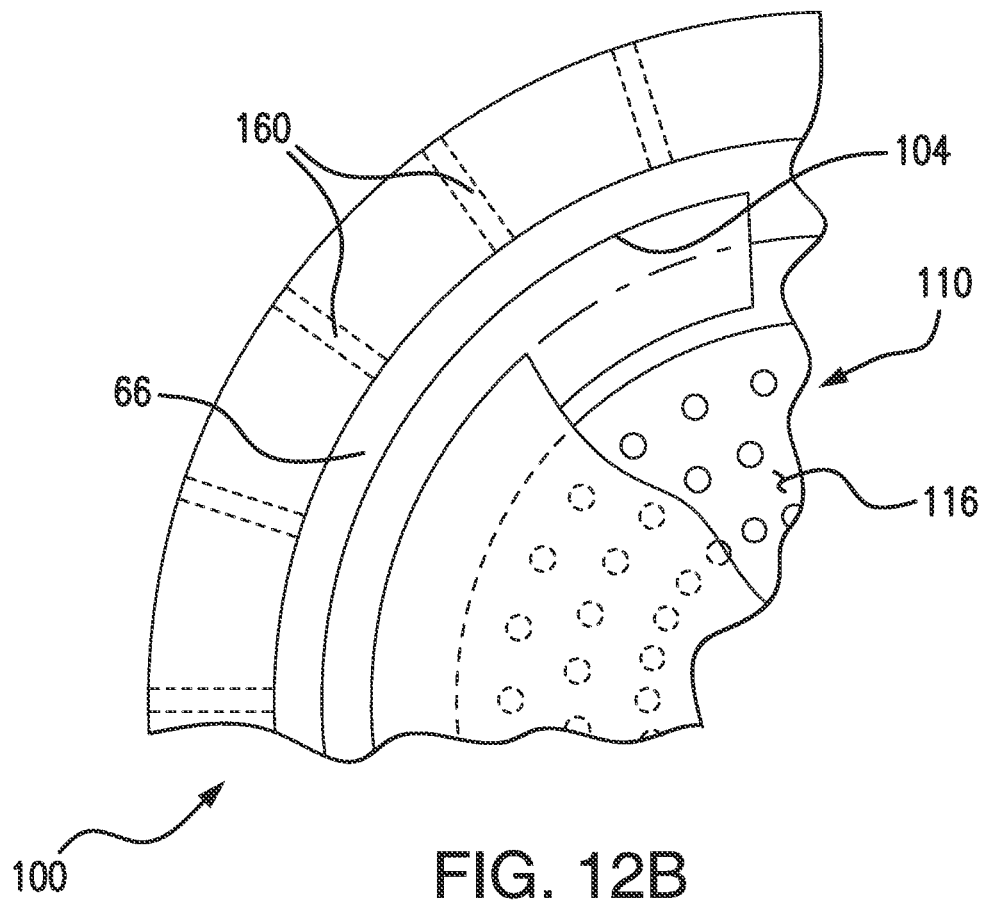

As shown in FIGS. 12A and 12B, in certain examples, the susceptor 100 may include the contact break 104 and the precursor vent array 106. In such examples the contact break 104 and the precursor vent array 106 are both located radially outward of the pocket portion 110 of the susceptor 100. More specifically, the contact break 104 is located radially outward of both the pocket portion 110 of the susceptor 100 and the precursor vent array 106 is located radially outward of the contact break 104. Specifically, the contact break 104 is located radially outward of the perforated surface 116 of the susceptor 100, is fluidly coupled to the perforated surface 116 of the susceptor 100, and the precursor vent array 106 is located radially outward of the contact break 104 and is fluidly coupled to the perforated surface 108 by the contact break 104. As will be appreciated by those of skill in the art in view of the present disclosure, fluidly coupling the precursor vent array 106 with the perforated surface 116 through the contact break 104 decreases concentration of precursor within the gap 66, and thereby limit through cooperation of the contact break 104 and the precursor vent array 106.

With reference to FIGS. 13A-16B, examples the susceptor 100 having the purge channel array 108 are shown. The purge channel array 108 is configured to flow purge gas, e.g., the purge gas 54 (shown in FIG. 1), from the lower chamber 42 (shown in FIG. 1) of the reactor 16 (shown in FIG. 1) to the purged volume 130 defined between the underside 58 of the substrate 14 and the perforated surface 116 of the susceptor 100. More specifically, the purge channel array 108 is located on the radially along the ledge surface 118 of the susceptor 100. Specifically, the purge channel array 108 is located on the ledge surface 118 radially between the periphery 60 of the substrate 14 and the perforated surface 116 of the susceptor 100. So located, the purge channel array 108 issues purge gas from the lower chamber 42 of the reactor 16 to the underside 58 of the substrate 14 circumferentially at a location adjacent to the periphery 60 of the substrate 14.

Figure 13A:
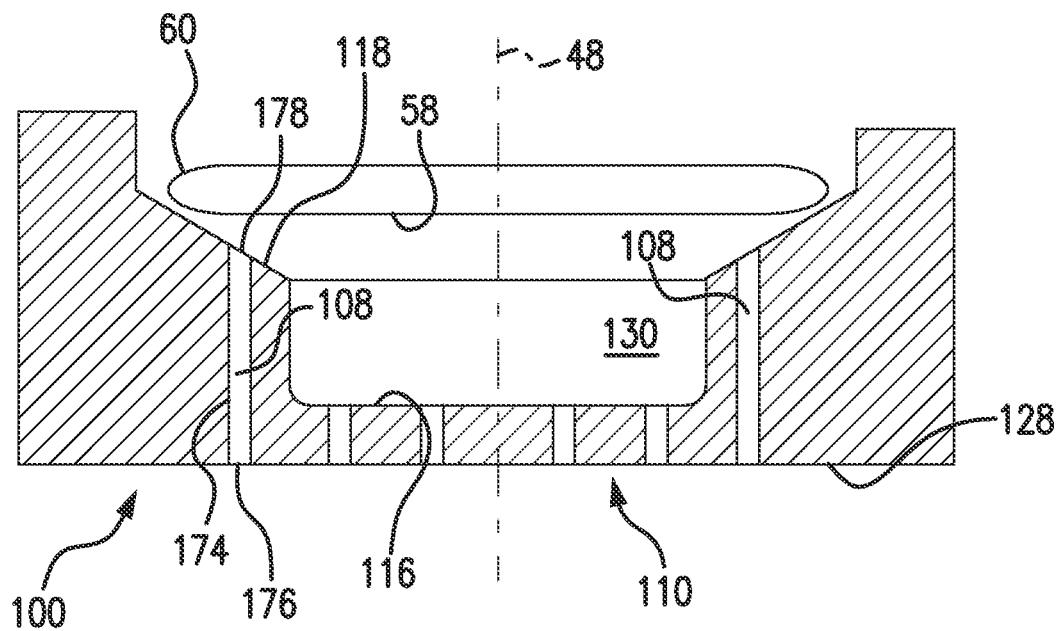
FIGS. 13A-16B are cross-sectional side views of additional examples of the susceptor of FIG. 1, showing susceptors with purge channels extending through the susceptor at locations radially outward of the pocket portion of the susceptor.
Figure 13B:
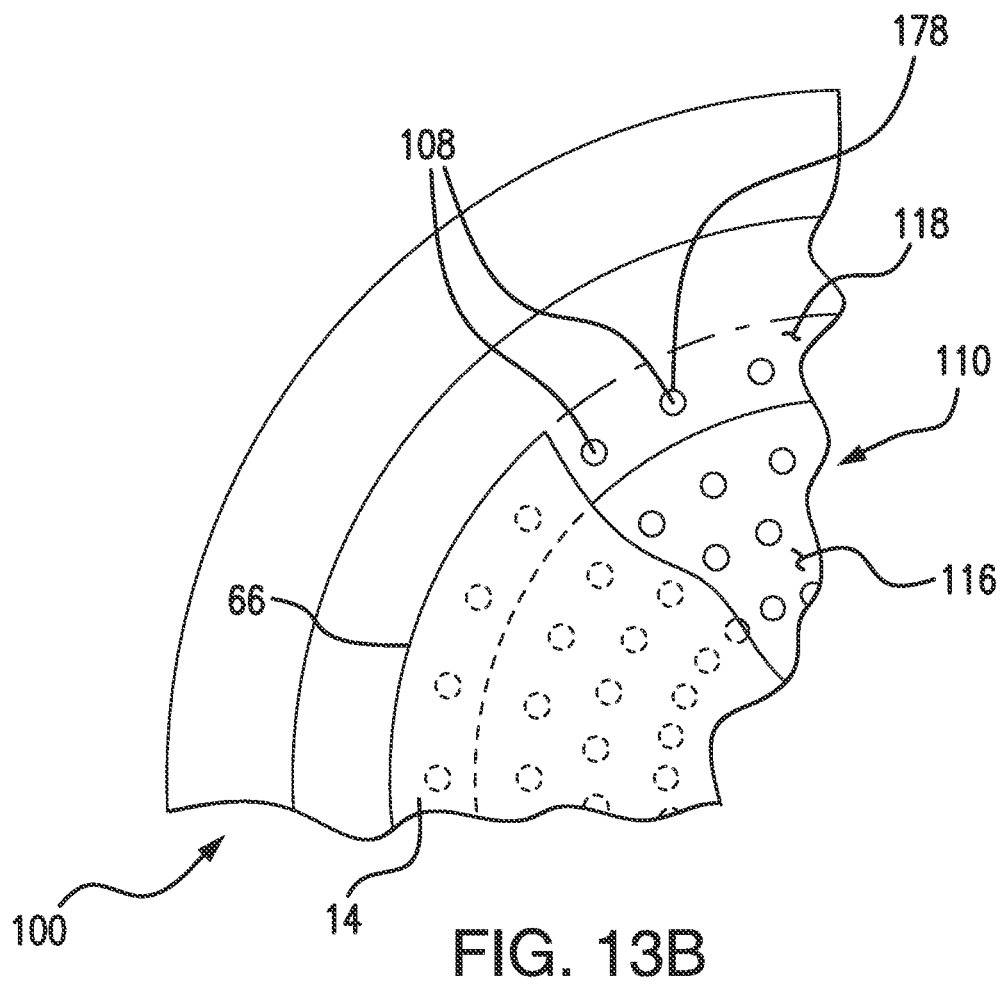

As shown in FIGS. 13A and 13B, the purge channel array 108 may include a purge channel 174. The purge channel 174 has a purge channel inlet 176 and a purge channel outlet 178. The purge channel inlet 176 is located on the lower surface 128 of the susceptor 100 and is fluidly coupled to the purge channel outlet 178 by the purge channel 174. The purge channel outlet 178 is located on the ledge surface 118 at a location radially inward of the periphery 60 of the substrate 14. In certain examples, the purge channel 174 extends axially through the susceptor 100. In accordance with certain examples, the purge channel 174 may be substantially parallel to the rotation axis 48. It is contemplated that, in certain examples, the purge channel 174 may be one of a plurality of purge channels 174 distributed circumferentially about the pocket portion 110 of the susceptor 100 on the ledge surface 118 and radially outward of the perforated surface 116 of the susceptor 100. It is also contemplated that, in accordance with certain examples, the plurality of purge channels 174 may be evenly distributed along the ledge surface 118 to uniformly issue purge gas against the underside 58 of the susceptor 100 at locations circumferentially adjacent to the periphery 60 of the substrate 14 and within the purged volume 130.

Figure 14A:
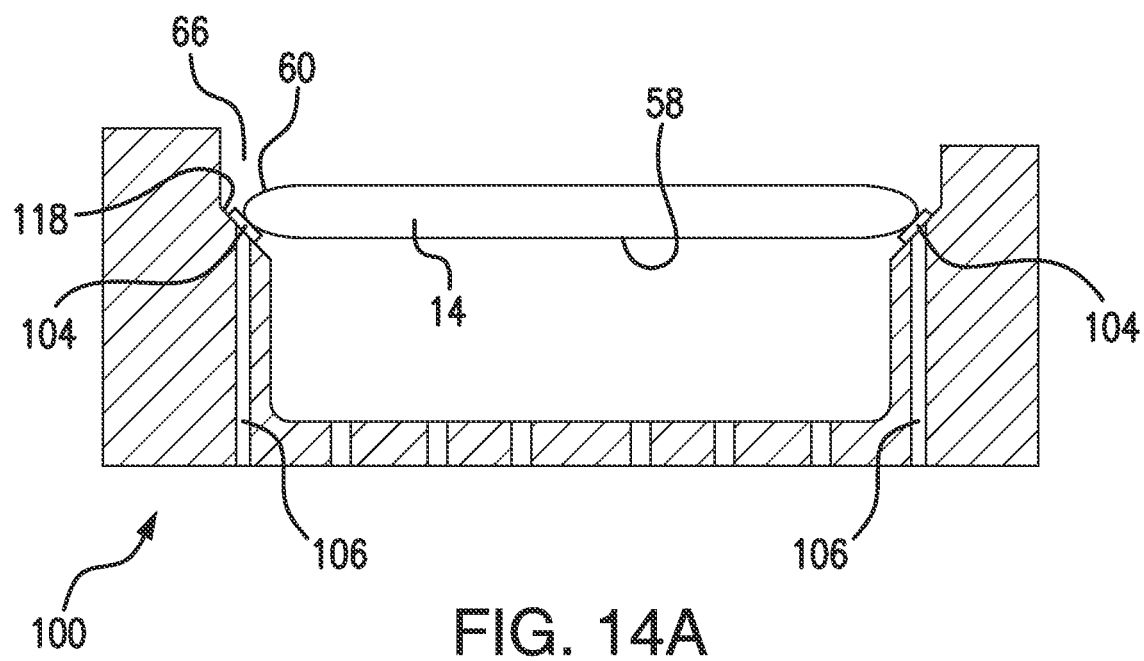
Figure 14B:
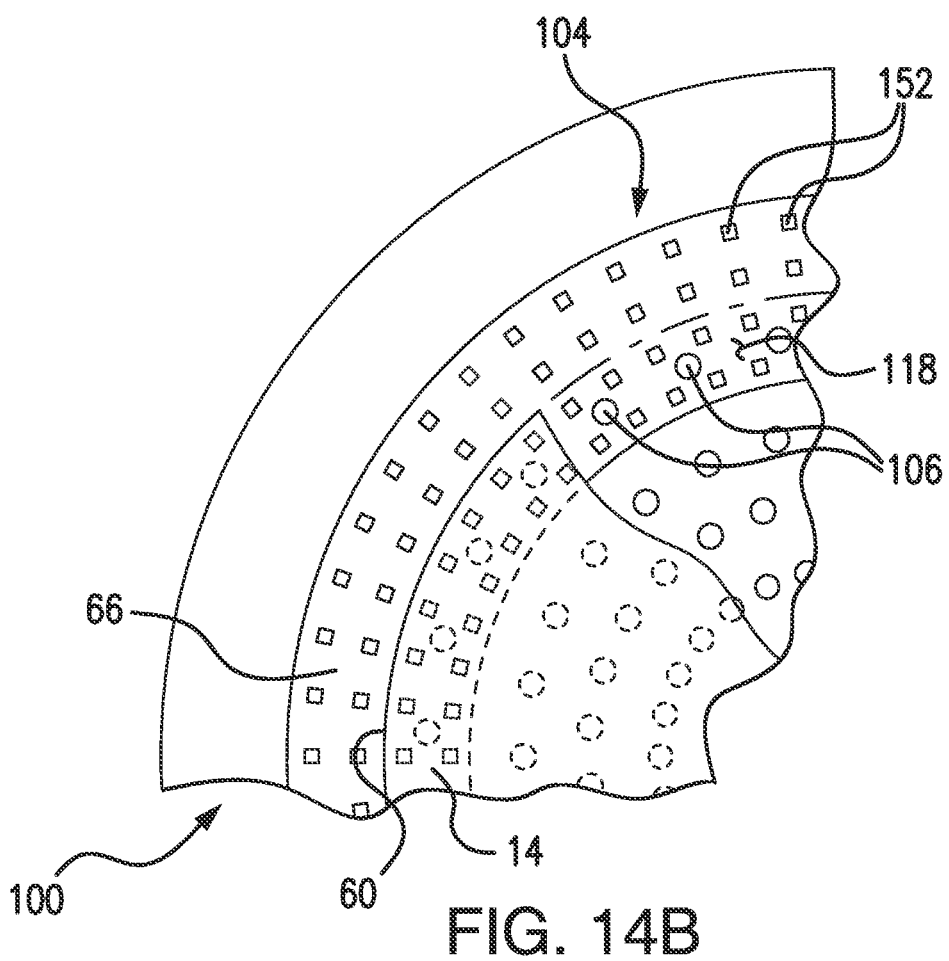

As shown in FIGS. 14A and 14B, in certain examples, the susceptor 100 may include both the contact break 104 and the purge channel array 108. In such examples the contact break 104 and the purge channel array 106 cooperate to limit (or prevent) bridging between the periphery 60 of the substrate 14 and the ledge surface 118 both radially inward and radially outward of the periphery 60 of the substrate 14. Specifically, the purge channel array 108 operates to issue purge gas 54 (shown in FIG. 1) against the underside 58 of the substrate 14 axially over the ledge surface 118 and radially inward of the periphery 60 of the substrate 14, and the contact break 104 operates flow the purge gas 54 radially outward and between the periphery 60 of the substrate 14 and the ledge surface 118 into the gap 66.

As will be appreciated by those of skill in the art in view of the present disclosure, issuing the purge gas against the underside 58 of the substrate 14 and thereafter flowing the purge gas 54 through the contact break 104 increases the area of the underside 58 and periphery 60 of the substrate 14 swept by the purge gas 54, further limiting (or preventing) bridging between the substrate 14 and the ledge surface 118 of the susceptor 100. Although shown in FIG. 14B as including the grid array 152, it is to be understood and appreciated that the contact break 104 may include the unpolished region 144 (shown in FIG. 4A), the partially polished region 146 (shown in FIG. 5A), the roughened region 148 (shown in FIG. 6A), or the purge slot 150 (shown in FIG. 7A) and remain within the scope of the present disclosure.

Figure 15A:
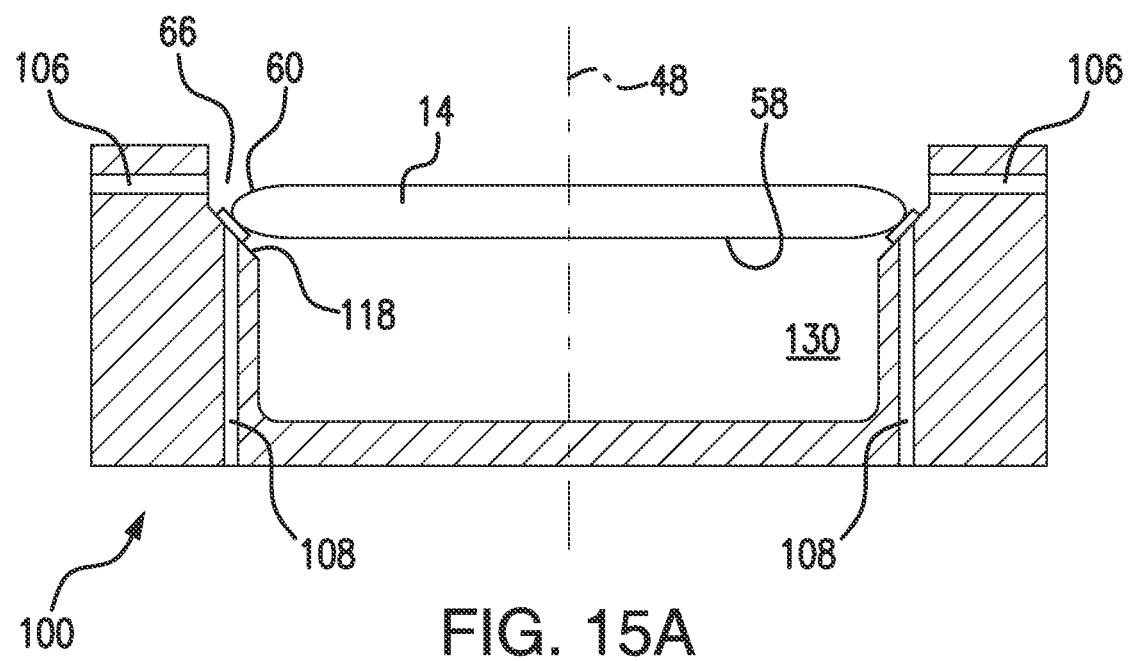
Figure 15B:
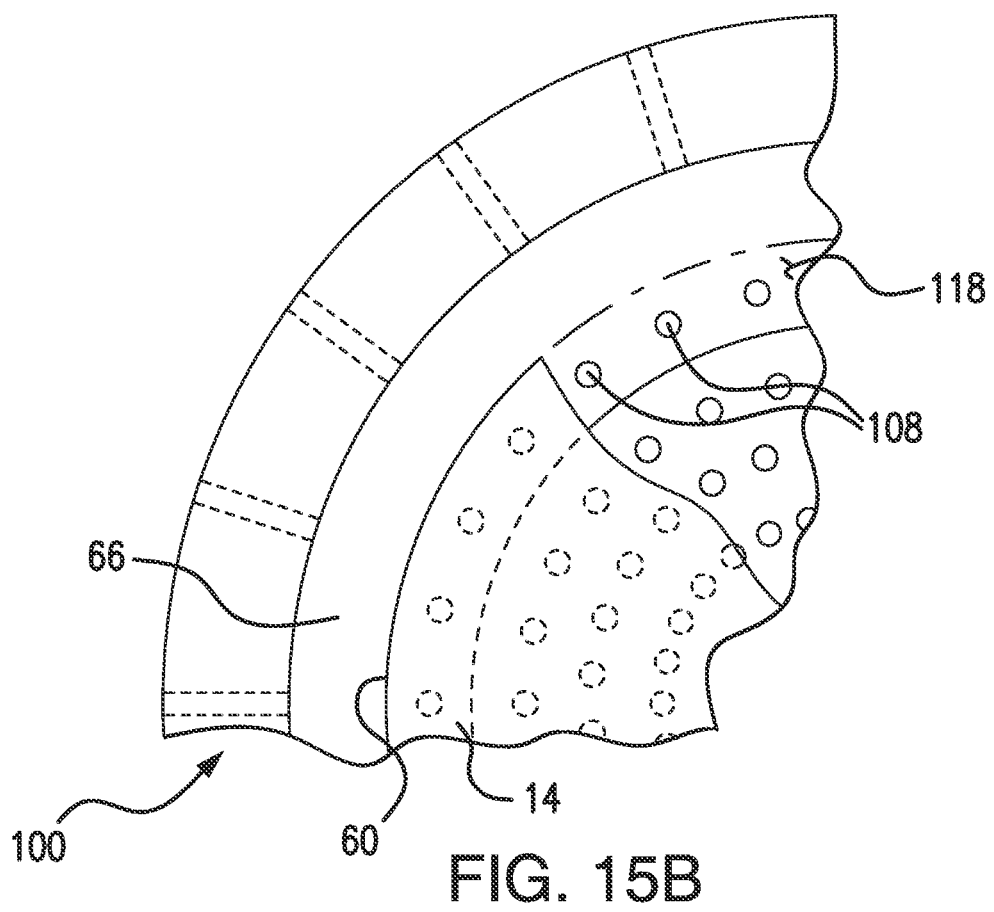

As shown in FIGS. 15A and 15B, in certain examples, the susceptor 100 may include both the precursor vent array 106 and the purge channel array 108. In such examples the purge channel array 108 and the precursor vent array 104 cooperate to limit (or prevent) bridging between the periphery 60 of the substrate 14 and the ledge surface 118 both radially inward and radially outward of the periphery 60 of the substrate 14. Specifically, the precursor vent array 106 operates to vent precursor from the gap 66 defined between the periphery 60 of the substrate 14, limiting (or preventing) bridging between the periphery 60 of the substrate 14 and the ledge surface 118 radially outward of the periphery 60 of the substrate 14, and the purge channel array 108 operates to issue purge gas 54 (shown in FIG. 1) against the underside 58 of the substrate 14 axially over the ledge surface 118 and radially inward of the periphery 60 of the substrate 14.

In certain examples, supporting of the substrate 14 by the ledge surface 118 may be such that the periphery 60 of the substrate 14 fluidly separates the purged volume 130 from the precursor vent array 106. In accordance with certain examples, supporting of the substrate 14 on the ledge surface 118 may be that purge flows from the purged volume 130 to the precursor vent array 106, the purge gas flow in such examples further limiting (or preventing) bridging between the substrate 14 and the ledge surface 118 of the susceptor 100. Although show in FIGS. 15A and 15B as including radial vents 156 forming the precursor vent array 106 it is to be understood and appreciated that the precursor vent array 106 may include axial vents 162 (shown in FIG. 10A) or oblique vents 168 (shown in FIG. 11A) and remain within the scope of the present disclosure.

Figure 16A:
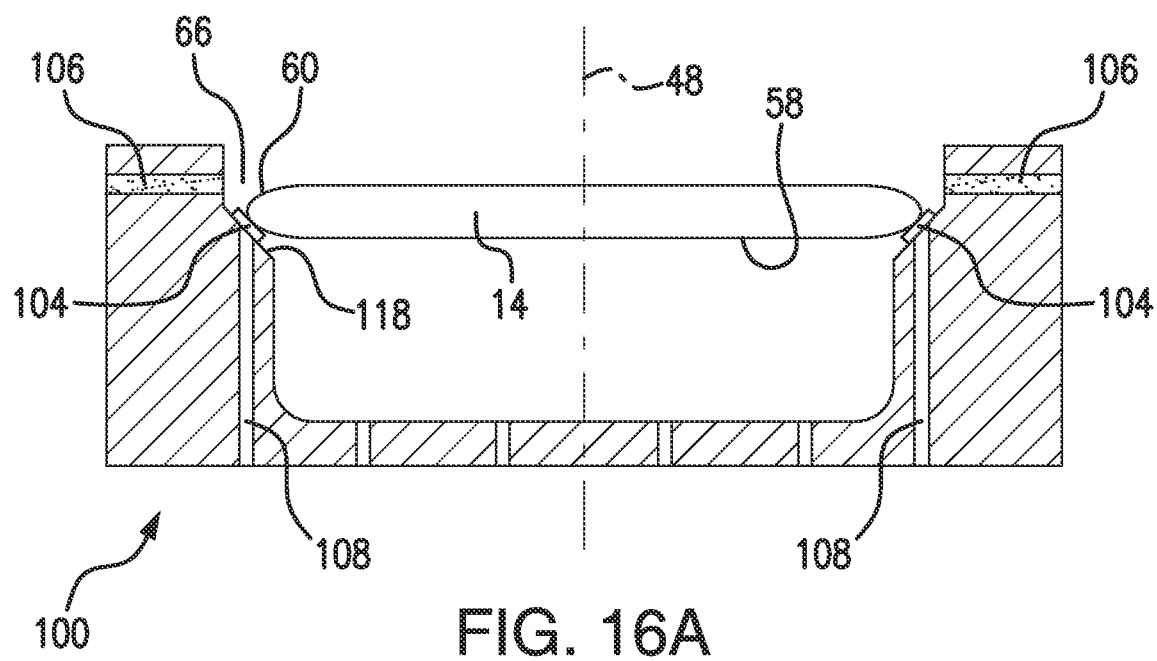
Figure 16B:
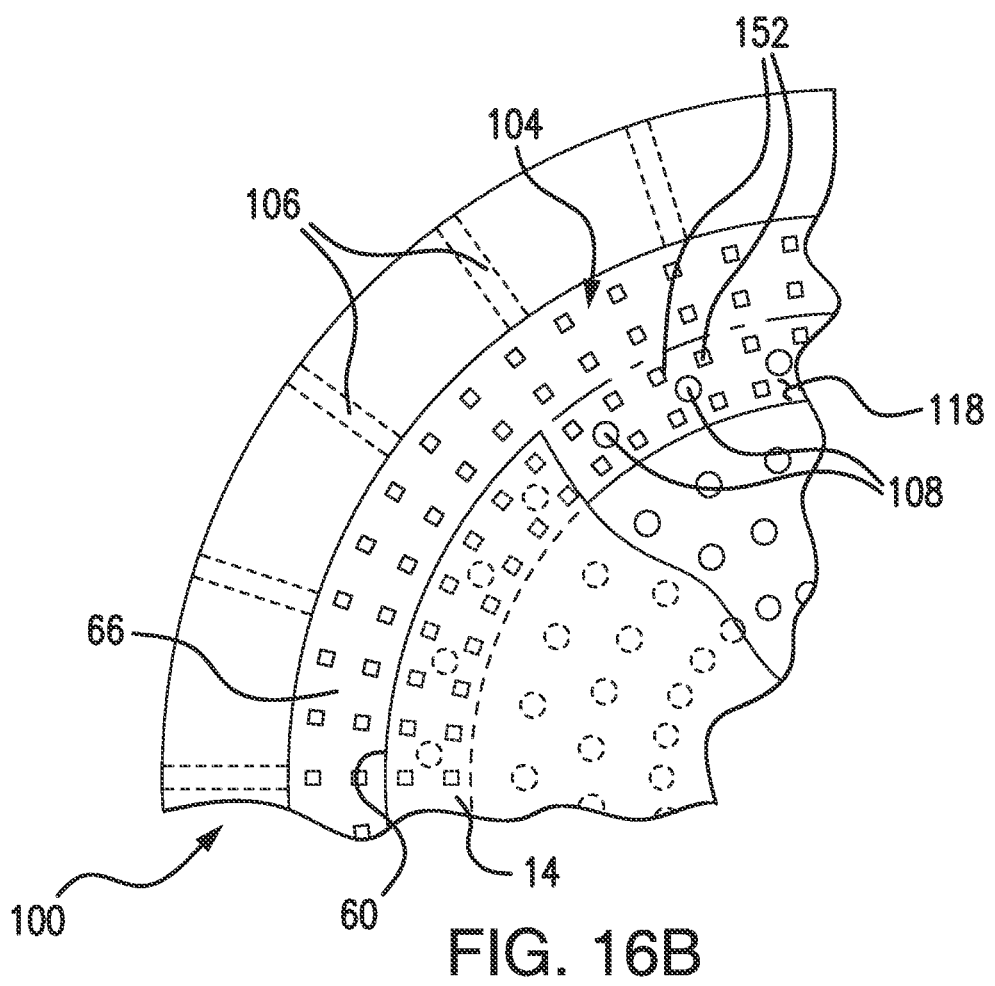

As shown in FIGS. 16A and 16B, in certain examples, the susceptor 100 may include the contact break 104, the precursor vent array 106, and the purge channel array 108. In such examples each of the contact break 104, the precursor vent array 106, and the purge channel array 108 may cooperate to limit (or prevent) bridging between the periphery 60 of the substrate 14 and the ledge surface 118 of the susceptor 100. Specifically, the purge channel array 108 may operate to issue the purge gas 54 against the underside 58 of the substrate 14 at a location adjacent to the periphery 60 of the substrate 14, the contact break 104 may operate to flow the purge gas 54 (shown in FIG. 1) radially outward between the periphery 60 of the substrate 14 and the ledge surface 118, and the precursor vent array 106 may operate to draw either (or both) the first precursor 52 (shown in FIG. 1) and the purge gas 54 from within the gap 66.

Although a specific example of contact break 104, the precursor vent array 106, and the purge channel array 108 are shown in FIGS. 16A and 16B, it is to be understood and appreciated that the susceptor 100 may include other types of contact breaks, precursor vent arrays, and purge channel arrays and remain within the scope of the present disclosure. For example, it is contemplated that the contact break 104 may include one of the unpolished region 144 (shown in FIG. 4A), the partially polished region 146 (shown in FIG. 5A), the roughened region 148 (shown in FIG. 6A), or the purge slot 150 (shown in FIG. 7A). It is also contemplated that the precursor vent array 106 may include the axial vent 162 (shown in FIG. 10A) or the oblique vent 168 (shown in FIG. 11A) by way of non-limiting examples.

With reference to FIG. 17A-17E, a method 200 of making a susceptor, e.g., the susceptor 100 (shown in FIG. 1), is shown. As shown with box 210, the method 200 includes defining a susceptor, e.g., the susceptor 100 (shown in FIG. 1). In certain examples, the method 200 may include defining a tuned pocket within the susceptor, e.g., the tuned pocket 102 (shown in FIG. 1), as shown with box 220. In accordance with certain examples, the method 200 may include locating a contact break on the ledge surface of the susceptor, e.g., the contact break 104 (shown in FIG. 1), as shown with box 230. It is contemplated that, in certain examples, the method 200 may include defining one or more precursor vents in the susceptor, e.g., the precursor vent array 206 (shown in FIG. 1), as shown with box 240. It is also contemplated that, in accordance with certain examples, the method 200 may include defining one or more purge channel in susceptor, e.g., the purge channel array 108 (shown in FIG. 1), as shown with box 250.

Figure 17A:
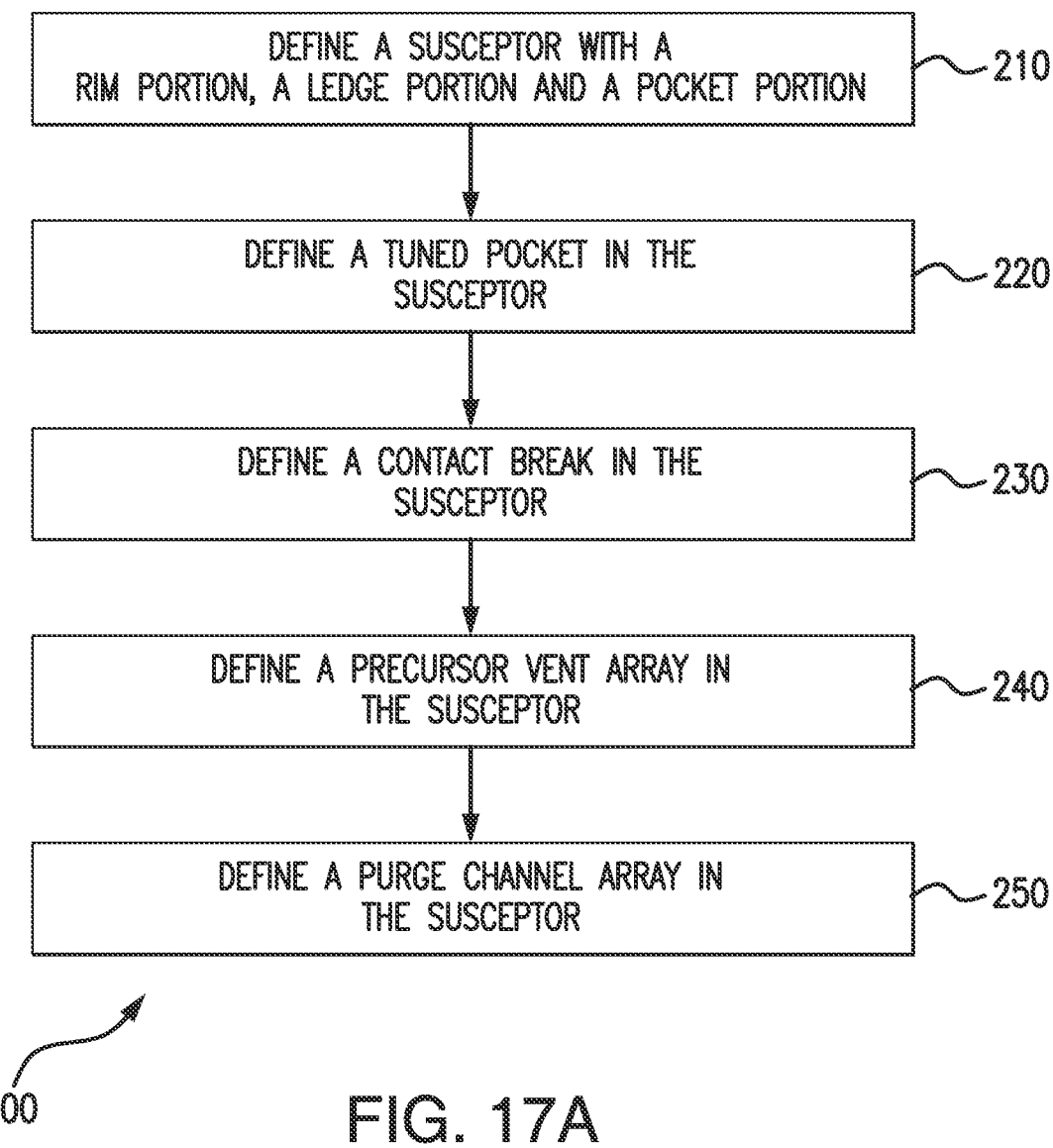
Figure 17B:
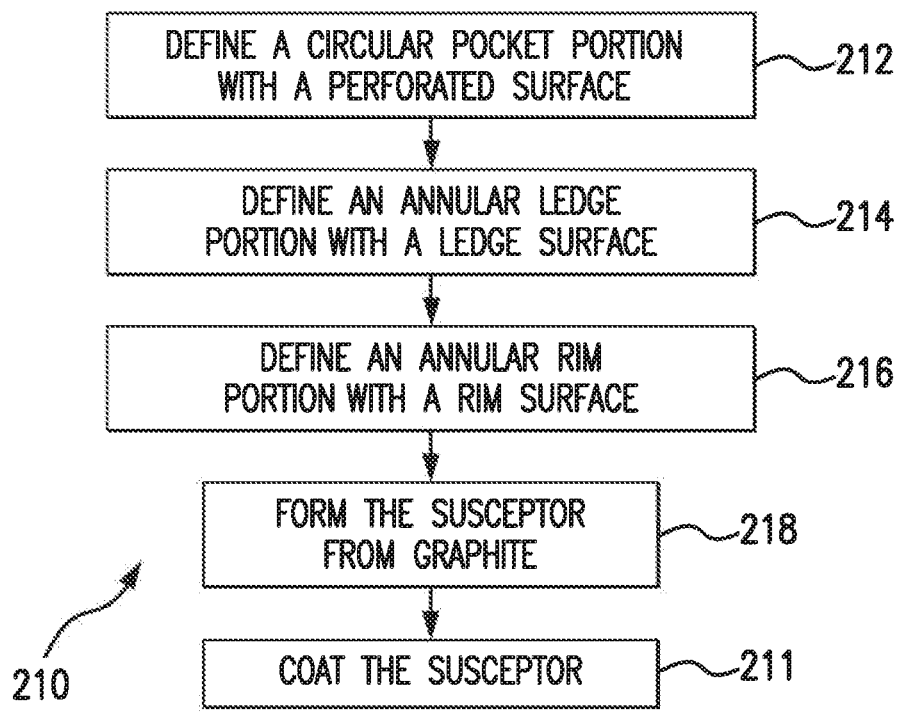

As shown in FIG. 17B, defining the susceptor may include defining a circular pocket portion with a perforated surface, e.g., the circular pocket portion 110 (shown in FIG. 2) having the perforated surface 116 (shown in FIG. 2), as shown with box 212. Defining the susceptor may include defining an annular ledge portion extending about pocket portion with a ledge surface, e.g., the ledge portion 112 (shown in FIG. 2) with the ledge surface 118 (shown in FIG. 2), as shown with box 214. Defining the susceptor may include defining an annular rim portion connected to the pocket portion by the ledge portion and having a rim surface, e.g., the rim portion 114 (shown in FIG. 2) with the rim surface 120 (shown in FIG. 2), as shown with box 216. It is contemplated that susceptor may be formed from graphite, e.g., graphite 132 (shown in FIG. 2), as shown with box 218. It is also contemplated that the susceptor may have a silicon-containing precoat, e.g., the silicon-containing precoat 134 (shown in FIG. 2), as shown with box 211.

Figure 17C:
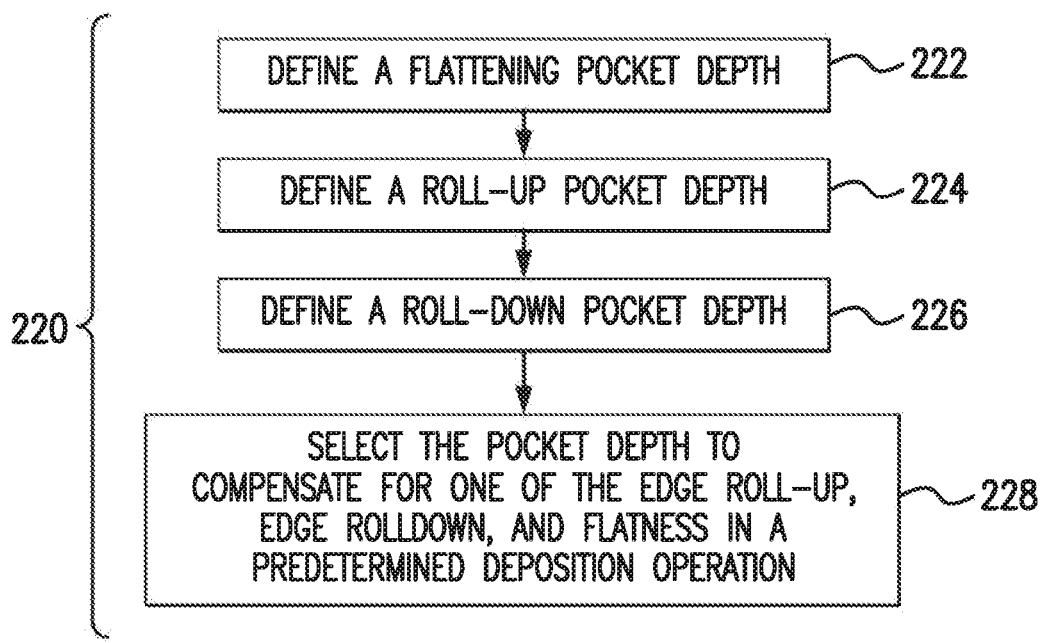

As shown in FIG. 17C, defining the tuned pocket may include defining a flattening pocket depth in the susceptor, e.g., the flattening pocket depth 138 (shown in FIG. 3A), as shown with box 222. Defining the tuned pocket may include defining a roll-up pocket depth in the susceptor, e.g. the roll-up pocket depth 142 (shown in FIG. 3B), as shown with box 224. Defining the tuned pocket may include defining a roll-down pocket depth in the susceptor, e.g., the roll-down pocket depth 142 (shown in FIG. 3C), as shown with box 226. The tuned pocket may be selected to offset one edge roll-up, flatness, or edge roll-down characteristic of a predetermined deposition operation (e.g., a nominal deposition operation), e.g., the deposition operation employed to deposit the film 12 (shown in FIG. 1), as shown with box 228.

Figure 17D:
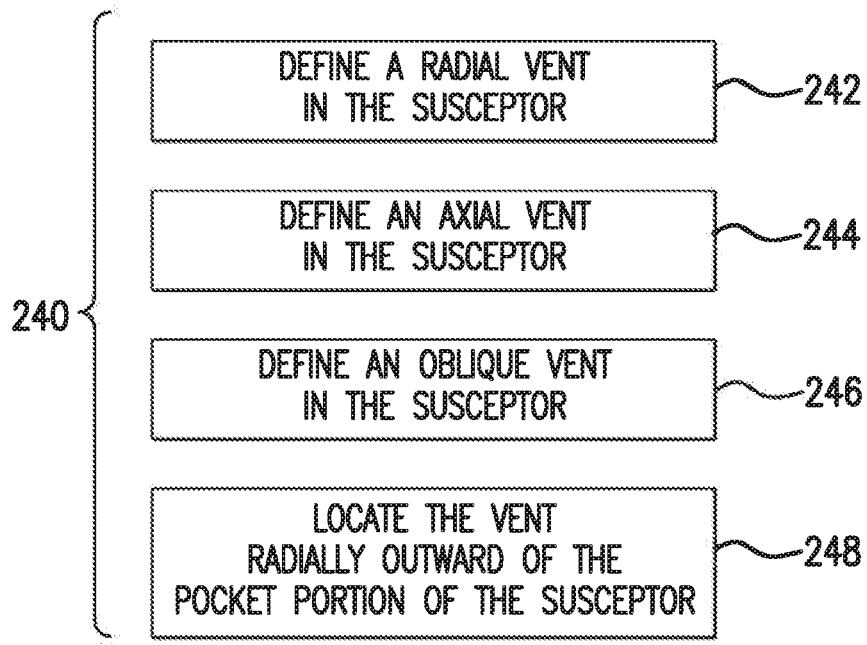

As shown in FIG. 17D, defining the contact break on the ledge surface may include leaving at least a portion of the ledge surface unpolished, e.g., the unpolished region 144 (shown in FIG. 4A), as shown with box 232. Defining the contact break on the ledge surface may include partially polishing at least a portion of the ledge surface to define a partially polished region of the ledge surface, e.g., the partially polished region 146 (shown in FIG. 5A), as shown with box 234. Defining he contact break on the ledge surface may include roughening a portion of the ledge surface to define a roughened region on the ledge surface, e.g., the roughened region 148 (shown in FIG. 6A), as shown with box 236. Defining the contact break on the ledge surface may include defining one or more purge slots in the ledge surface, e.g., the purge slot 150 (shown in FIG. 7A), as show with box 238. It is also contemplated defining the contact break may include defining a grid structure in the ledge surface, e.g., the grid structure 152 (shown in FIG. 8A), as shown with box 231. The grid structure may be defined by milling or scribing the ledge surface by way of non-limiting examples.

Figure 17E:
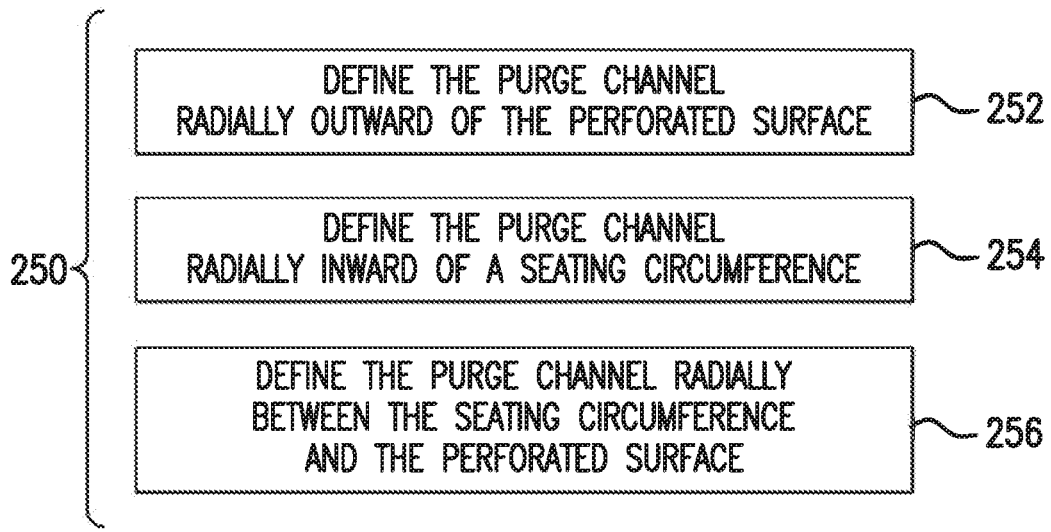

As shown in FIG. 17E, defining the one or more precursor vents in the susceptor may include defining one or more radial vent in the susceptor, e.g., the radial vent 156 (shown in FIG. 9A), as shown with box 242. Defining the one or more precursor vents may include defining one or more axial vents in the susceptor, e.g. the axial vent 162 (shown in FIG. 10A), as shown with box 244. Defining the one or more precursor vents may include defining one or more oblique vents in the susceptor, e.g., the oblique vent 168 (shown in FIG. 11A), as shown with box 246. It is contemplated that the precursor vents may be defined at locations radially outward of the pocket portion of the susceptor, e.g., in the ledge portion and/or in the rim portion of the susceptor, as show with box 248.

As also shown in FIG. 17E, defining the one or more purge channels may include defining the one or more purge channel radially outward of the perforated surface of the susceptor, as shown with box 252. Defining the one or more purge channels may include defining the one or more purge channel radially inward of a support circumference of the susceptor, e.g., the support circumference 136 (shown in FIG. 3A), as shown with box 254. Defining the one or more purge channel may include defining the one or more purge channel radially between the support circumference and the perforate surface of the susceptor, as shown with box 256.

Figure 18A:
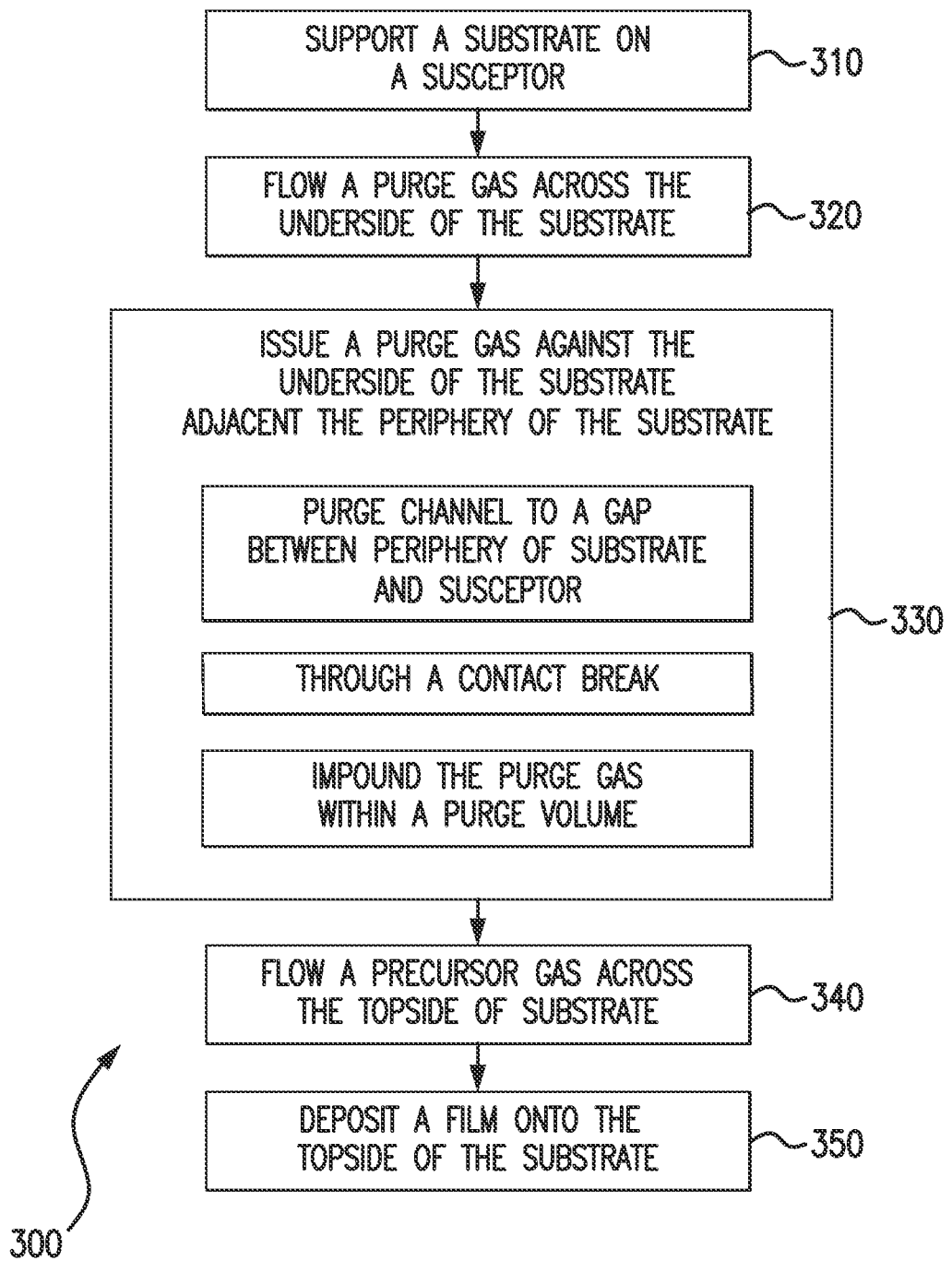

With reference to FIG. 18A, a film deposition method 300 is shown. The method 300 includes supporting a substrate on a ledge surface of a susceptor, e.g., the substrate 14 (shown in FIG. 1) on the ledge surface 118 (shown in FIG. 2) of the susceptor 100 (shown in FIG. 1), as shown with box 310. A purge gas is flowed across the underside of the substrate, e.g., the purge gas 54 (shown in FIG. 1) flowed across the underside 58 (shown in FIG. 1) of the substrate 14 (shown in FIG. 1), as shown with box 320. A precursor is flowed across the topside of the substrate, e.g., across the topside 56 (shown in FIG. 1) of the substrate 14 (shown in FIG. 1), as shown with box 330, and a film, e.g., the film 12 (shown in FIG. 1) deposited onto the topside of the substrate, as shown with box 340.

Figure 18B:
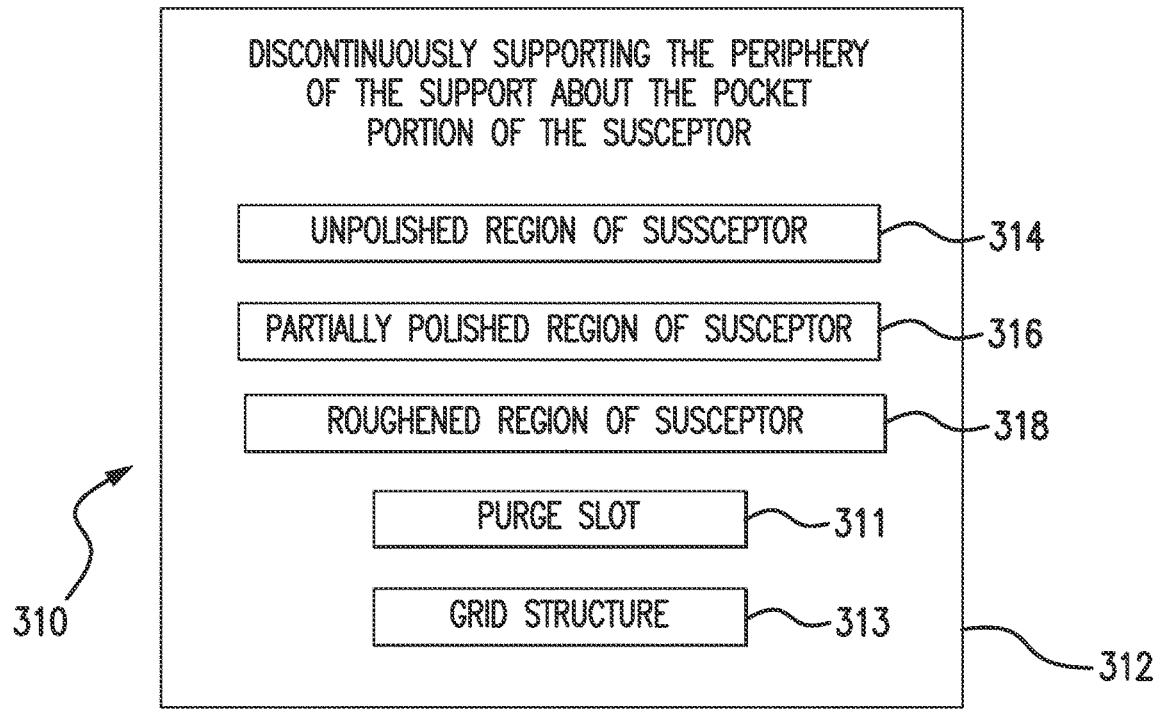

As shown in FIG. 18B, supporting the substrate with the susceptor may include discontinuously supporting the underside of the substrate about the periphery of the substrate using a contact break, e.g., the contact break 104 (shown in FIG. 1), as shown with box 312. Discontinuous support may be provided by an unpolished region of the susceptor, e.g., the unpolished region 144 (shown in FIG. 4A), as shown with box 314. Discontinuous support may be provided by a partially polished region of the susceptor, e.g., the partially polished region 146 (shown in FIG. 5A), as shown with box 316. Discontinuous support may be provided by a roughened region of the susceptor, e.g., the roughened region 148 (shown in FIG. 6A), as shown with box 318. In certain examples, discontinuous support may be provided by a purge slot defined by the susceptor, e.g., the purge slot 150 (shown in FIG. 7A), as shown with box 311. It is also contemplated that, in accordance with certain examples, that discontinuous support may be provided by a grid structure defined by the susceptor, e.g., the grid structure 152 (shown in FIG. 8A), as shown with box 313.

Figure 18E:
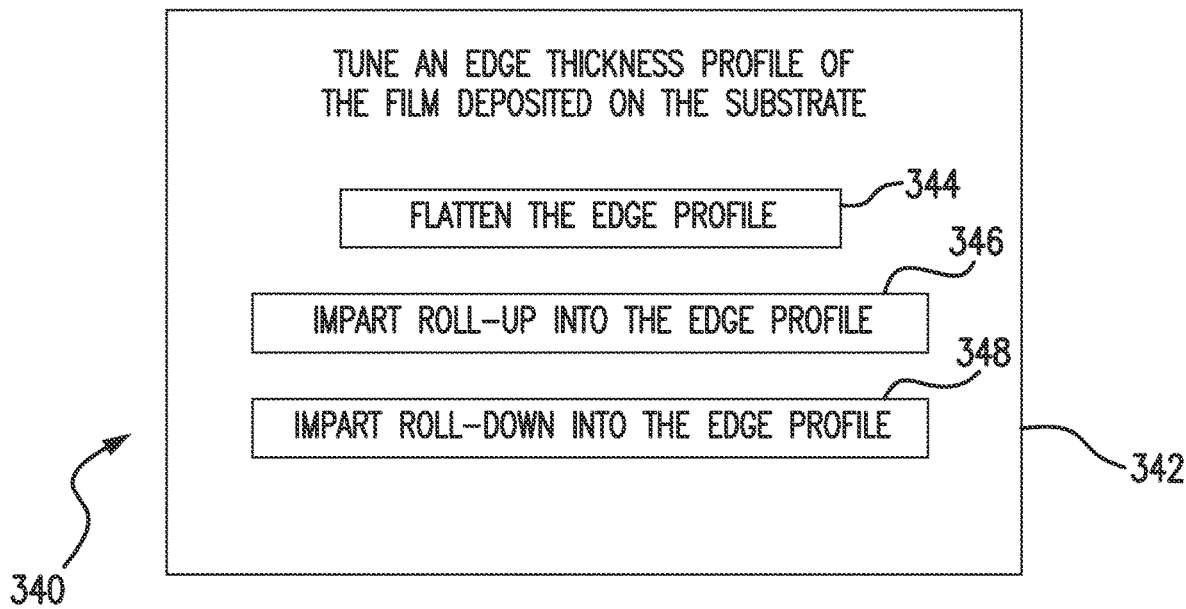
Figure 18C:
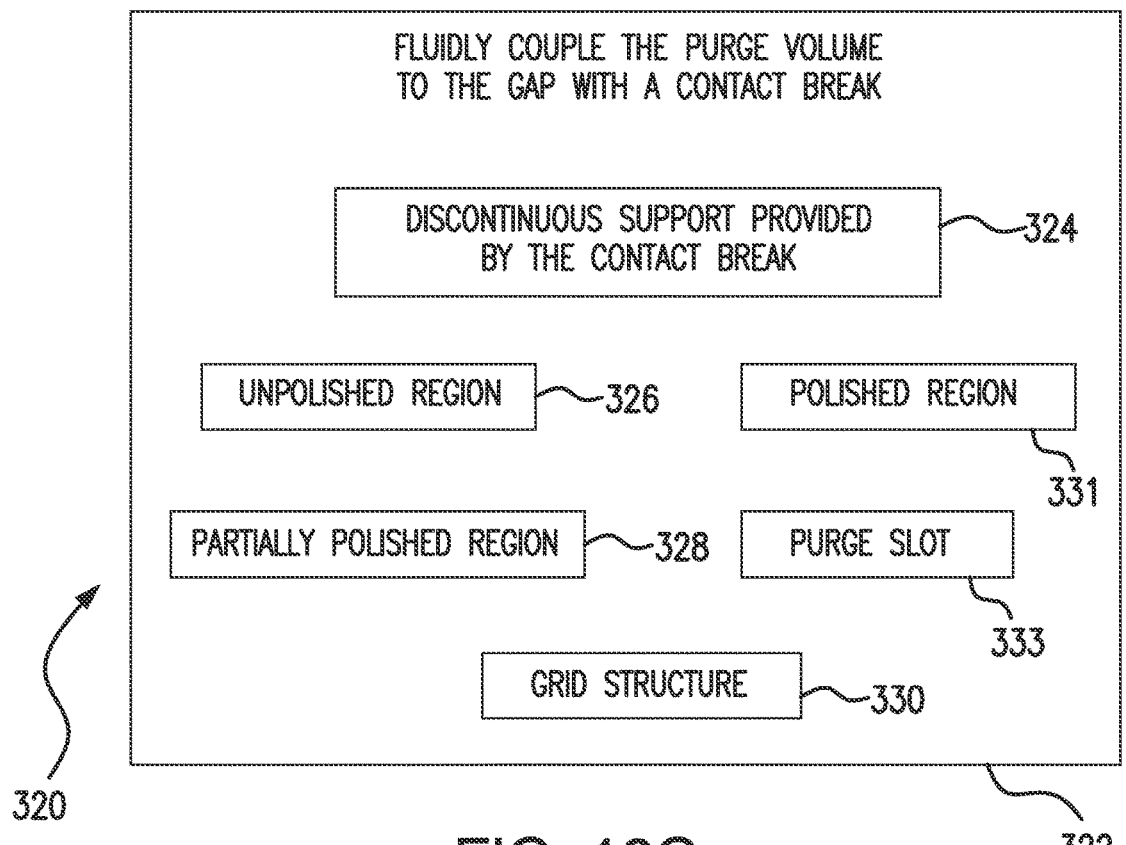

As shown in FIG. 18C, flowing the purge gas across the underside of the substrate may include fluidly coupling a purged volume defined between the underside of the substrate and the perforated surface of the susceptor and gap defined between the periphery of the substrate and the rim portion of the susceptor, e.g., the purged volume 130 (shown in FIG. 1) and gap 66 (shown in FIG. 1), as shown with box 322. Fluid coupling may be accomplished by discontinuously supporting the periphery of the substrate about the susceptor using a contact break, e.g., the contact break 104 (shown in FIG. 1), as shown with 324. For example, fluid coupling may be accomplished by an unpolished region of the susceptor, e.g., the unpolished region 144 (shown in FIG. 4A), as shown with box 326. Fluid coupling may be accomplished with a partially polished region of the susceptor, e.g., the partially polished region 146 (shown in FIG. 5A), as shown with box 328. Fluid coupling may be accomplished with a roughened region, e.g., the roughened region 148 (shown in FIG. 6A), as shown by box 321. It is also contemplated that fluid coupling may be accomplished by a purge slot, e.g., the purge slot 150 (shown in FIG. 7A), or by grid structure, e.g., the grid structure 152 (shown in FIG. 8A), as shown by box 323 and box 325.

Figure 18D:
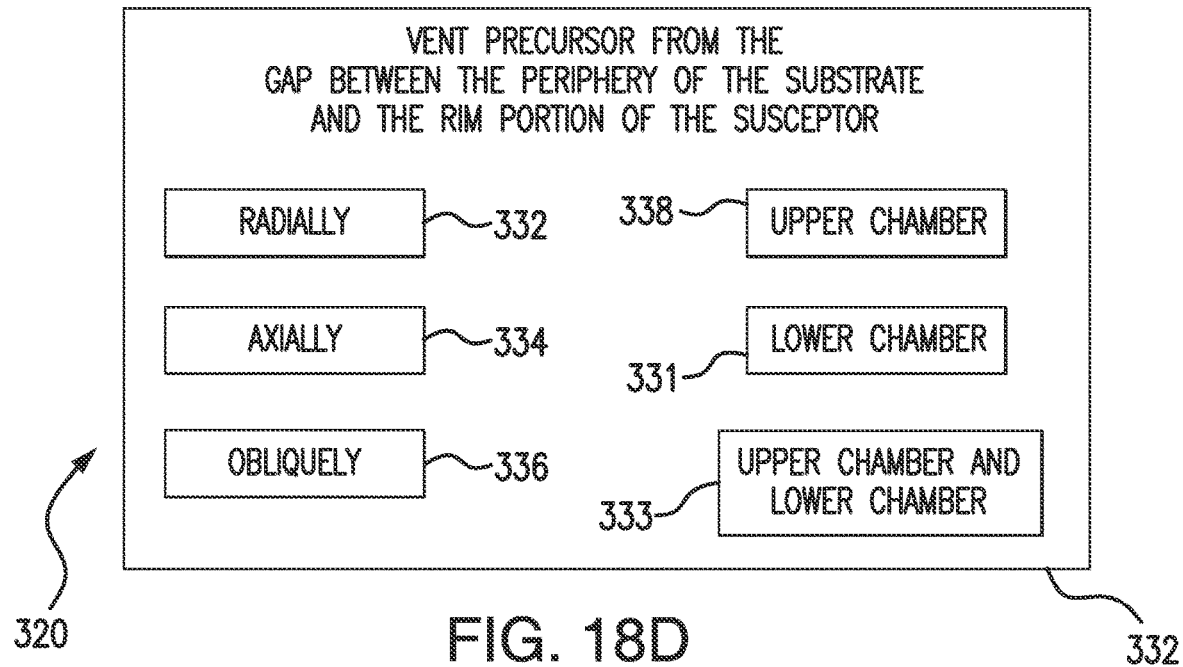

As shown in FIG. 18D, flowing the precursor across the topside of the substrate may include venting precursor from within a gap defined between the periphery of the substrate and the rim portion of the substrate, e.g., the gap 66 (shown in FIG. 1), as shown with box 332. For example, precursor may be vented radially from the gap using a radial vent, e.g., the radial vent 156 (shown in FIG. 9A), as shown with box 334. In such as examples the precursor may be vented from the gap to an upper chamber of the reactor containing the substrate, e.g., the upper chamber 40 (shown in FIG. 1), as shown with box 336. Precursor may be axially vented from the gap using an axial vent, e.g., the axial vent 162 (shown in FIG. 10A), as shown with box 338. In such as examples the precursor may be vented from the gap to a lower chamber of the reactor containing the substrate, e.g., the lower chamber 42 (shown in FIG. 1), as shown with box 331 Precursor may be vented obliquely from the gap using an oblique vent, e.g., the oblique vent 168 (shown in FIG. 11A), as shown with box 333. In such as examples the precursor may be vented from the gap to both the upper chamber and the lower chamber of the reactor, as shown with box 335.

As shown in FIG. 18E, flowing the depositing the film onto the substrate may include tuning an edge thickness profile of the film deposited onto the substrate with a tuned pocket of the susceptor, e.g., the tuned pocket 102 (shown in FIG. 1), as shown with box 342. For example, a flattened edge thickness profile may be imparted into the film using a flattening pocket depth defined by the tuned pocket, e.g., the flattened edge thickness profile B (shown in FIG. 3A) imparted using the flattening pocket depth 138 (shown in FIG. 3A), as shown with box 344. In certain examples, a roll-up edge thickness profile may be imparted into the film using a roll-up pocket depth defined by the tuned pocket, e.g., the roll-up edge thickness profile C (shown in FIG. 3B) imparted using the roll-up pocket depth 142 (shown in FIG. 3B), as shown with box 346. It is also contemplated that, in certain examples, a roll-down edge thickness profile may be imparted into the film using a roll-down pocket depth defined by the tuned pocket, e.g., the roll-down edge thickness profile D (shown in FIG. 3C) imparted using the roll-down pocket depth 140 (shown in FIG. 3C), as shown with box 348.

With continuing reference to FIG. 18A, the method 300 may include issuing a purge gas against the underside of the substrate at a location adjacent to the periphery of the substrate through a purge channel, e.g., issuing the purge gas 54 (shown in FIG. 1) through the purge channel 174 (shown in FIG. 13A), as shown with box 350. In certain examples, the purge gas may flow from the purge channel to the gap between periphery of the substrate and the rim portion of the substrate, e.g., through the contact break 104 (shown in FIG. 1), as shown with box 352. In such examples the purge gas flowing from the purge channel and through the contact break may sweep precursor out of the gap, e.g., through the purge channel array 108 (shown in FIG. 1), as shown with box 354. It is also contemplated that the purge gas issued against the underside of the substrate adjacent the periphery may remain impounded within the purged volume, e.g., according the roughness of the ledge portion 112 (shown in FIG. 2) of the susceptor, as shown with box 356.

The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

What is claimed is:

1. A susceptor, comprising:
   a circular pocket portion arranged along a rotation axis and having a perforated surface;
   an annular ledge portion extending circumferentially about the circular pocket portion and having a ledge surface, the ledge surface sloping upward along the rotation axis from the perforated surface and having a support circumference at which the ledge surface is arranged to support a substrate along a periphery of the substrate; and
   an annular rim portion extending circumferentially about the annular ledge portion, connected to the circular pocket portion by the annular ledge portion of the susceptor, and having a planar rim surface axially offset from the ledge surface of the susceptor;
   wherein the planar rim surface and the support circumference define therebetween a tuned pocket adapted to tune an edge thickness, relative to a radially inner region of the substrate of a film deposited onto the substrate supported on the ledge surface of the susceptor.

2. The susceptor of claim 1, wherein the tuned pocket defines a flattening pocket depth configured to flatten film thickness onto the substrate radially inward of the periphery of the substrate relative to the radially inner region of the substrate.

3. The susceptor of claim 2, wherein the susceptor is formed from graphite, and wherein the flattening pocket depth is between about 0.8 millimeters and about 1.09 millimeters.

4. The susceptor of claim 2, wherein the ledge surface is arranged to support the substrate such that a topside of the substrate is axially between the planar rim surface of the annular rim portion and the perforated surface of the circular pocket portion.

5. The susceptor of claim 1, wherein the tuned pocket defines a roll-up pocket depth configured to increase film thickness onto the substrate radially inward of the periphery of the substrate relative to the radially inner region of the substrate.

6. The susceptor of claim 5, wherein the roll-up pocket depth is less than a flattening pocket depth, wherein the roll-up pocket depth is less than a roll-down flattening pocket depth.

7. The susceptor of claim 5, wherein the ledge surface is arranged to support the substrate such that a topside of the substrate is substantially coplanar with the planar rim surface of the annular rim portion.

8. The susceptor of claim 1, wherein the tuned pocket defines roll-down pocket depth configured to decrease film thickness onto the substrate radially inward of the periphery of the substrate relative to the radially inner region of the substrate.

9. The susceptor of claim 8, wherein the roll-down pocket depth is greater than a roll-up pocket depth, wherein the roll-down pocket depth is greater than a flattening pocket depth.

10. The susceptor of claim 8, wherein the ledge surface is arranged to support the substrate such that a topside of the substrate is axially between the planar rim surface of the annular rim portion and the perforated surface of the circular pocket portion.

11. The susceptor of claim 1, wherein the susceptor is formed from graphite, wherein the graphite is encapsulated by a silicon carbide coating.

12. The susceptor of claim 1, wherein the susceptor has at least one of:
    (a) a contact break located on the ledge surface of the susceptor to limit contact between the substrate and the ledge surface of the susceptor;
    (b) a purge channel array located on the ledge surface of the susceptor to flow a purge gas between the periphery of the substrate and the ledge surface of the susceptor; and
    (c) a precursor vent array located radially outward of the perforated surface to vent precursor from within a gap defined between the substrate and the annular rim portion of the susceptor.

13. A semiconductor processing system, comprising:
    a reactor having a hollow interior;
    a divider seated within the hollow interior of the reactor with a divider aperture, the divider dividing the hollow interior of the reactor into an upper chamber and a lower chamber;
    a susceptor arranged within the hollow interior of the reactor and supported for rotation about a rotation axis, the rotation axis extending through the divider aperture, wherein the susceptor comprises:
    a circular pocket portion arranged along the rotation axis and having a perforated surface;
    an annular ledge portion extending circumferentially about the circular pocket portion and having a ledge surface, the ledge surface sloping upward along the rotation axis from the perforated surface and having a support circumference at which the ledge surface is arranged to support a substrate along a periphery of the substrate; and an annular rim portion extending circumferentially about the annular ledge portion, connected to the circular pocket portion by the annular ledge portion of the susceptor, and having a planar rim surface axially offset from the ledge surface of the susceptor; wherein the planar rim surface and the support circumference define therebetween a tuned pocket to tune an edge thickness, relative to a radially inner region of the substrate, of a film deposited onto the substrate supported on the ledge surface of the susceptor;

a purge source connected to the reactor and configured to flow a purge gas through the lower chamber of the reactor; and a precursor source connected to the reactor and configured to flow a precursor gas through the upper chamber of the reactor.

14. A film deposition method, comprising:

at a susceptor including a circular pocket portion arranged along a rotation axis and having a perforated surface; an annular ledge portion extending circumferentially about the circular pocket portion and having a ledge surface, the ledge surface sloping upward along the rotation axis from the perforated surface and having a support circumference at which the ledge surface is arranged to support a substrate along a periphery of the substrate; and an annular rim portion extending circumferentially about the annular ledge portion, connected to the circular pocket portion by the annular ledge portion of the susceptor, and having a planar rim surface axially offset from the annular ledge surface of the susceptor; the planar rim surface and the support circumference defining therebetween a tuned pocket configured and adapted to tune an edge thickness, relative to a radially inner region of the substrate, of a film deposited onto the substrate supported on the ledge surface of the susceptor, supporting the substrate on the ledge surface of the susceptor, the substrate having a topside and an underside axially separated from one another by the periphery of the substrate;

flowing a purge gas through the perforated surface and into a purged volume defined between the underside of the substrate and the perforated surface of the susceptor;

flowing a precursor gas across the topside of the substrate;

depositing the film onto the topside of the substrate using the precursor gas; and tuning edge thickness of the film deposited onto the topside of the substrate using the tuned pocket defined by the susceptor.

15. The method of claim 14, wherein the tuned pocket is a flattening pocket depth, the method further comprising homogenizing precursor concentration within a gap relative to precursor concentration at the radially inner region of the substrate.

16. The method of claim 14, wherein the tuned pocket is a roll-up pocket depth, the method further comprising increasing precursor concentration within a gap relative to precursor concentration at the radially inner region of the substrate.

17. The method of claim 14, wherein the tuned pocket is a roll-down pocket depth, the method further comprising decreasing precursor concentration within a gap relative to precursor concentration at the radially inner region of the substrate.

18. The method of claim 14, further comprising limiting contact between the substrate and the ledge surface of the susceptor with a contact break located on the ledge surface of the susceptor.

19. The method of claim 14, further comprising flowing the purge gas between the periphery of the substrate and the ledge surface of the susceptor with a purge channel array located on the ledge surface of the susceptor.

20. The method of claim 14, further comprising venting precursor from a gap defined between the periphery of the substrate and the annular rim portion of the susceptor using a precursor vent array located radially outward of the perforated surface of the susceptor.

21. A susceptor, comprising:

a circular pocket portion arranged along a rotation axis and having a perforated surface;

an annular ledge portion extending circumferentially about the circular pocket portion and having a ledge surface, wherein the ledge surface slopes upward along the rotation axis from the perforated surface; and an annular rim portion extending circumferentially about the annular ledge portion, connected to the circular pocket portion by the annular ledge portion of the susceptor, and having a planar rim surface axially offset from the ledge surface of the susceptor, wherein the ledge surface has a support circumference at which the ledge surface is configured to support a periphery of a substrate such that a topside of the substrate is substantially coplanar with the planar rim surface or is axially between the planar rim surface and the perforated surface of the circular pocket portion.

22. The susceptor of claim 21, wherein the substrate is about 750 microns thick.

23. The susceptor of claim 22, wherein the periphery of the substrate includes a chamfer or a bevel.

* * * * *